(12) United States Patent
Abe

(10) Patent No.: US 8,164,253 B2
(45) Date of Patent: Apr. 24, 2012

(54) OPTICALLY-FUNCTIONAL FILM AND METHOD OF MANUFACTURING THE SAME, DISPLAY AND METHOD OF MANUFACTURING THE SAME

(75) Inventor: Kaoru Abe, Fukushima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/052,577

(22) Filed: Mar. 21, 2011

(65) Prior Publication Data
US 2011/0234088 A1 Sep. 29, 2011

(30) Foreign Application Priority Data
Mar. 24, 2010 (JP) ................................ P2010-068123

(51) Int. Cl.
*H01J 1/62* (2006.01)
*H01J 9/00* (2006.01)
*B32B 9/00* (2006.01)

(52) U.S. Cl. .......... 313/504; 445/23; 428/688; 428/689; 359/586

(58) Field of Classification Search .......... 313/498–512; 445/23–25; 359/586, 582, 588; 428/214, 428/688, 689
See application file for complete search history.

(56) References Cited

U.S. PATENT DOCUMENTS
2007/0126353 A1  6/2007  Kubota et al.

FOREIGN PATENT DOCUMENTS
JP  2008-515129  5/2008

*Primary Examiner* — Joseph L Williams
(74) *Attorney, Agent, or Firm* — K&L Gates LLP

(57) ABSTRACT

There are provided an optically-functional film allowed to prevent peeling due to adhesion failure or deterioration due to moisture diffusion and a method of manufacturing the same, and a display allowed to prevent a decline in luminance and a color change depending on a viewing angle and a method of manufacturing the same. The optically-functional film includes: an intermediate layer, made of an insulating material including silicon, and having silicon-containing particles therein or on a top surface thereof; and an outermost layer made of the same material as that of the intermediate layer, whereas having a density higher than that of the intermediate layer, and having a bottom surface in contact with a top surface of the intermediate layer and a top surface with asperities.

12 Claims, 27 Drawing Sheets

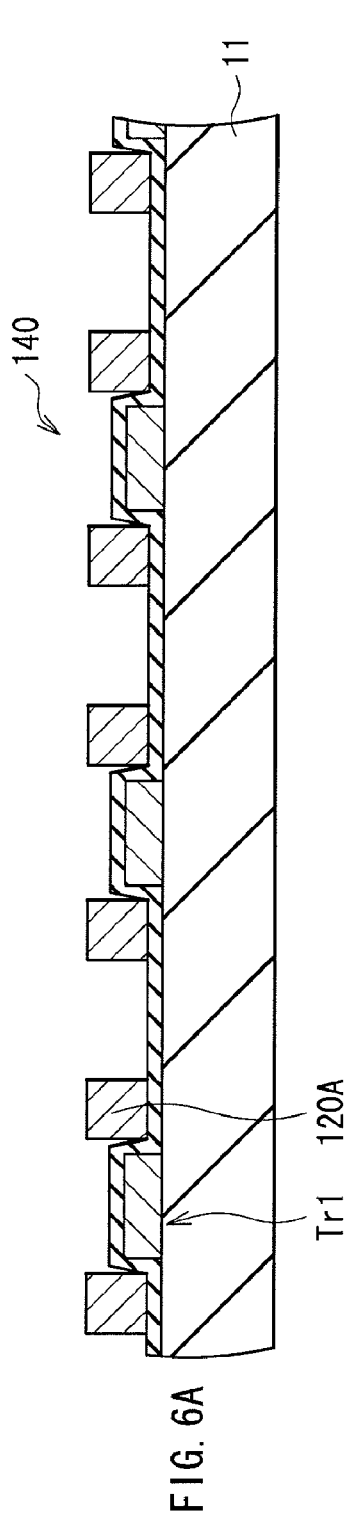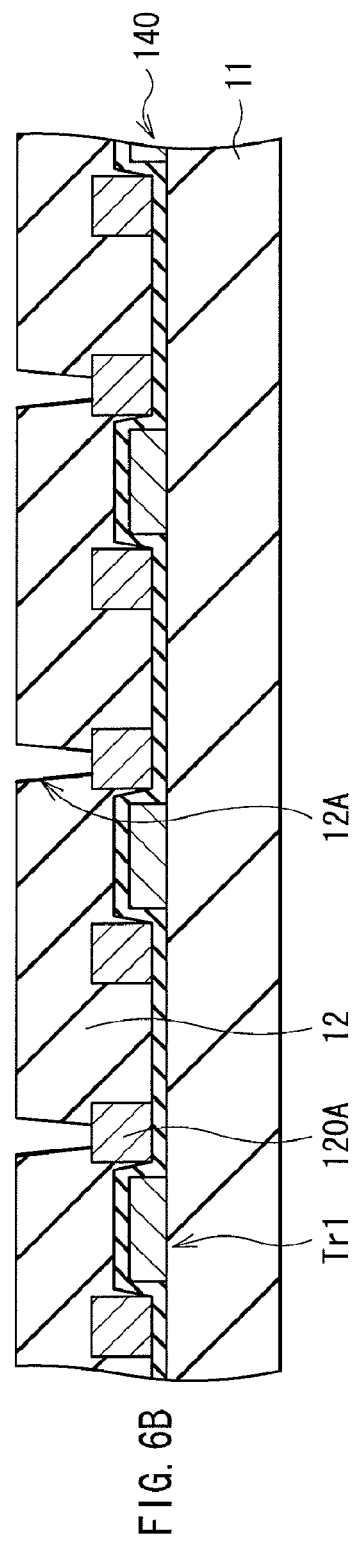

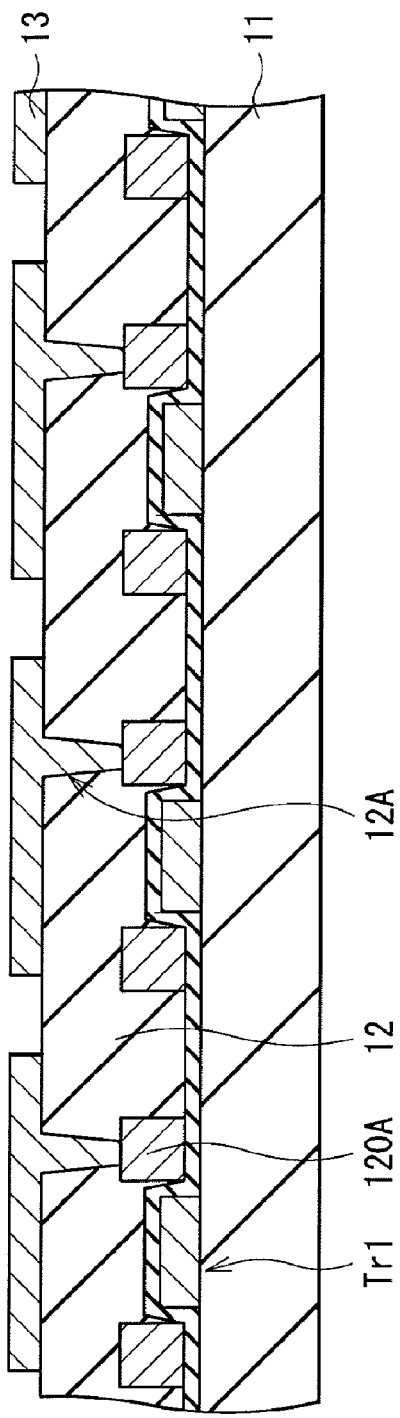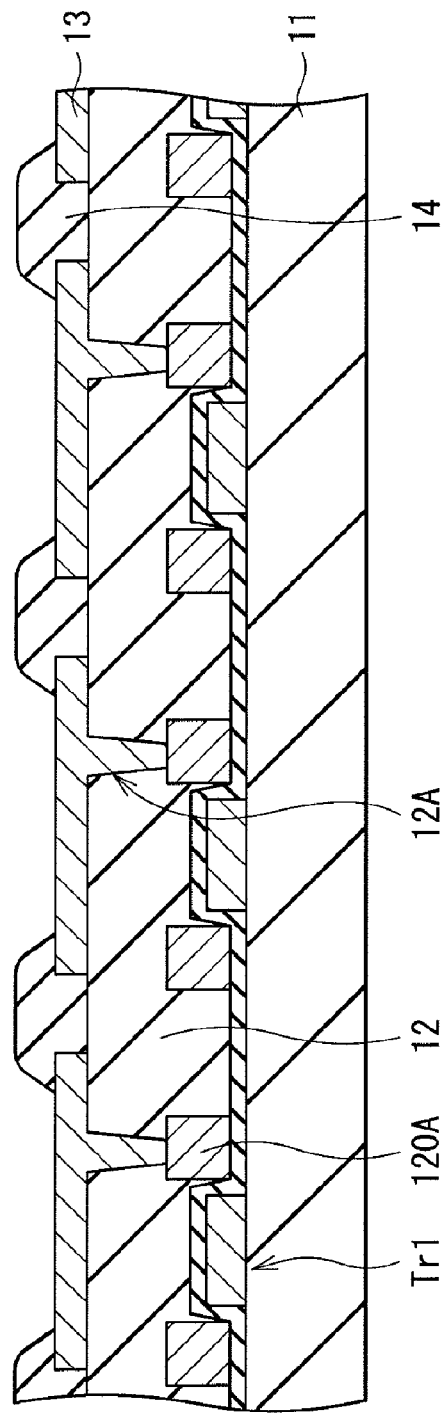

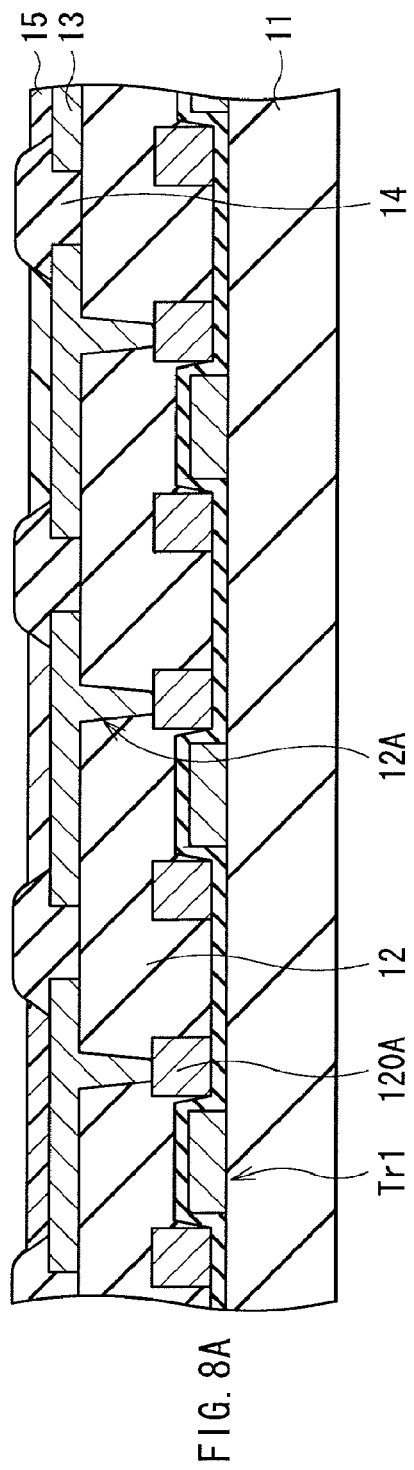
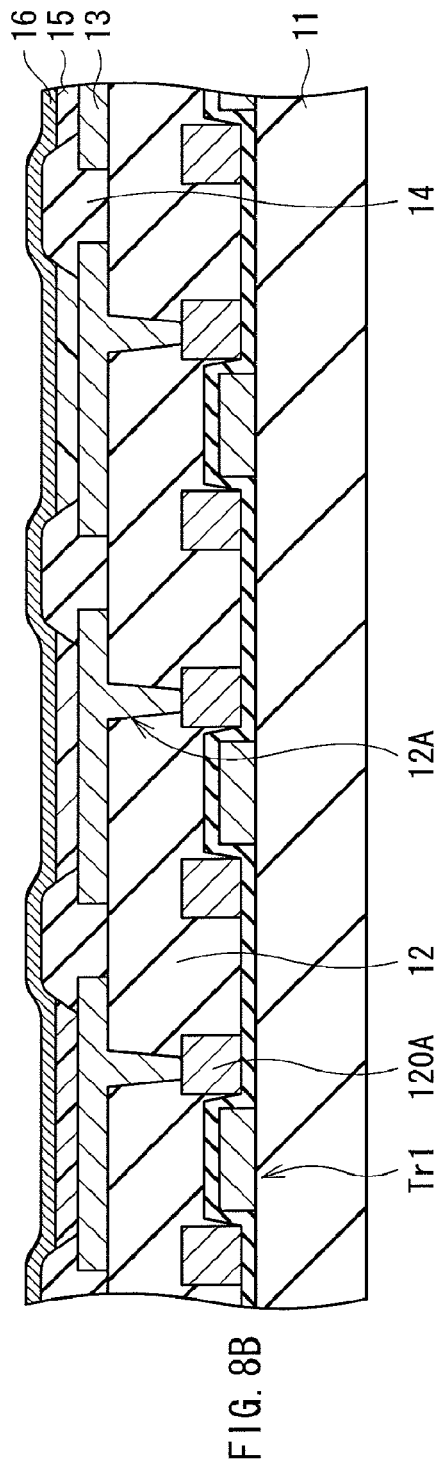
FIG. 8A
FIG. 8B

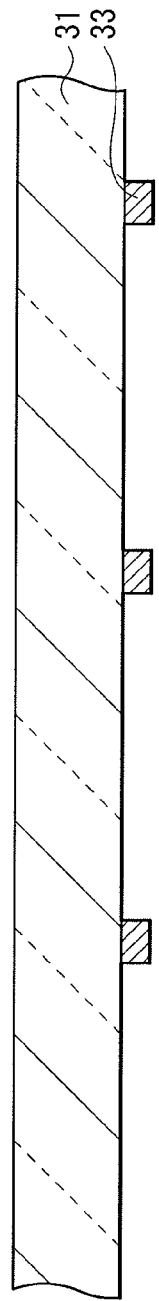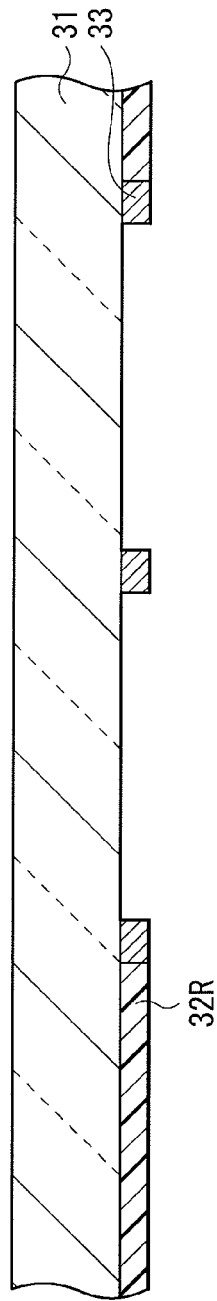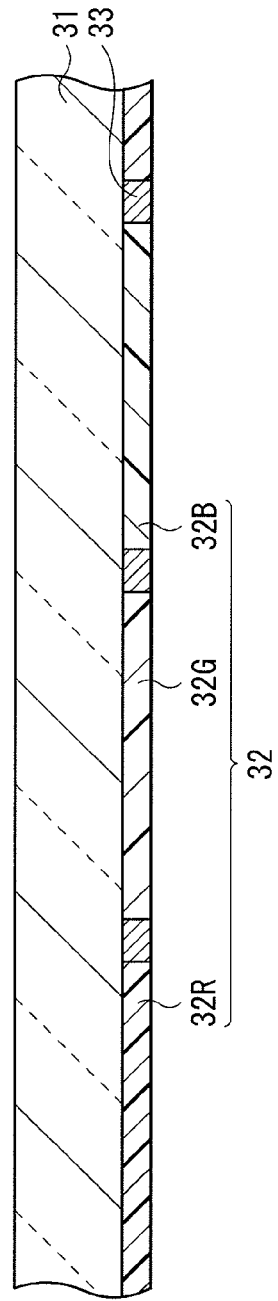

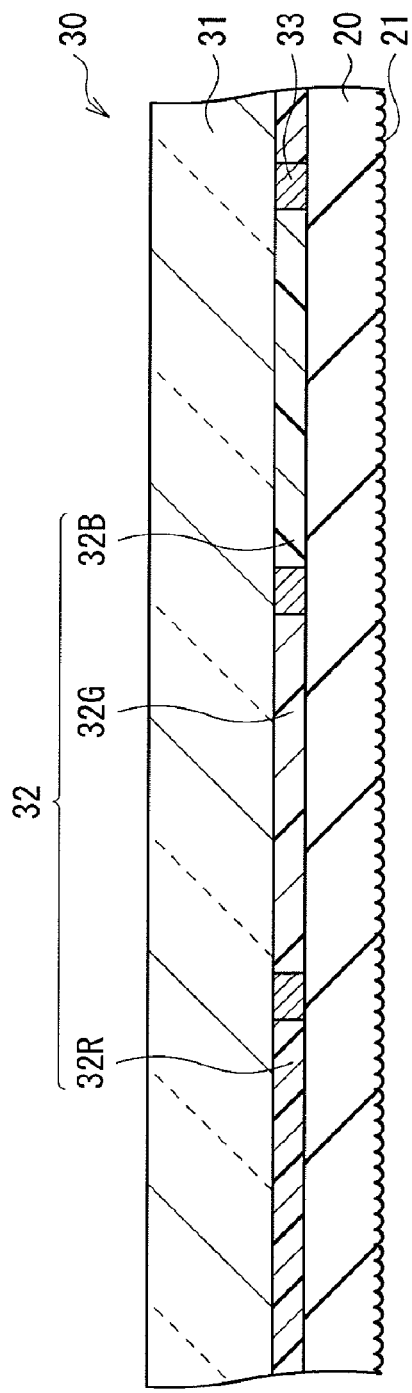
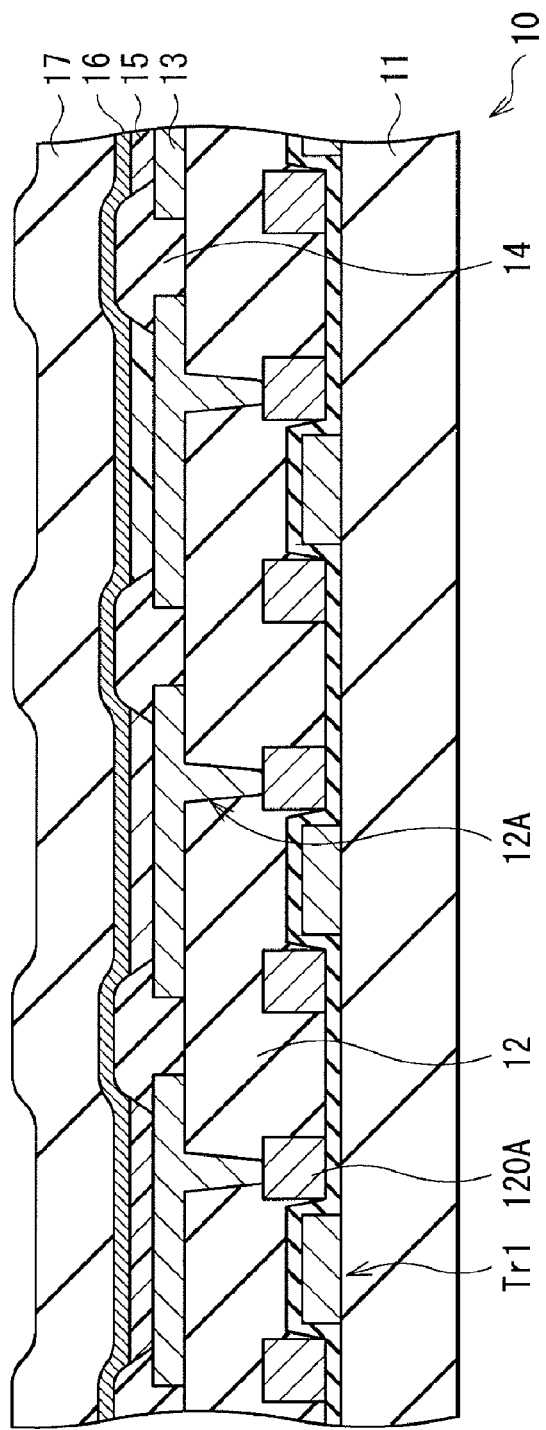
FIG. 24A
FIG. 24B

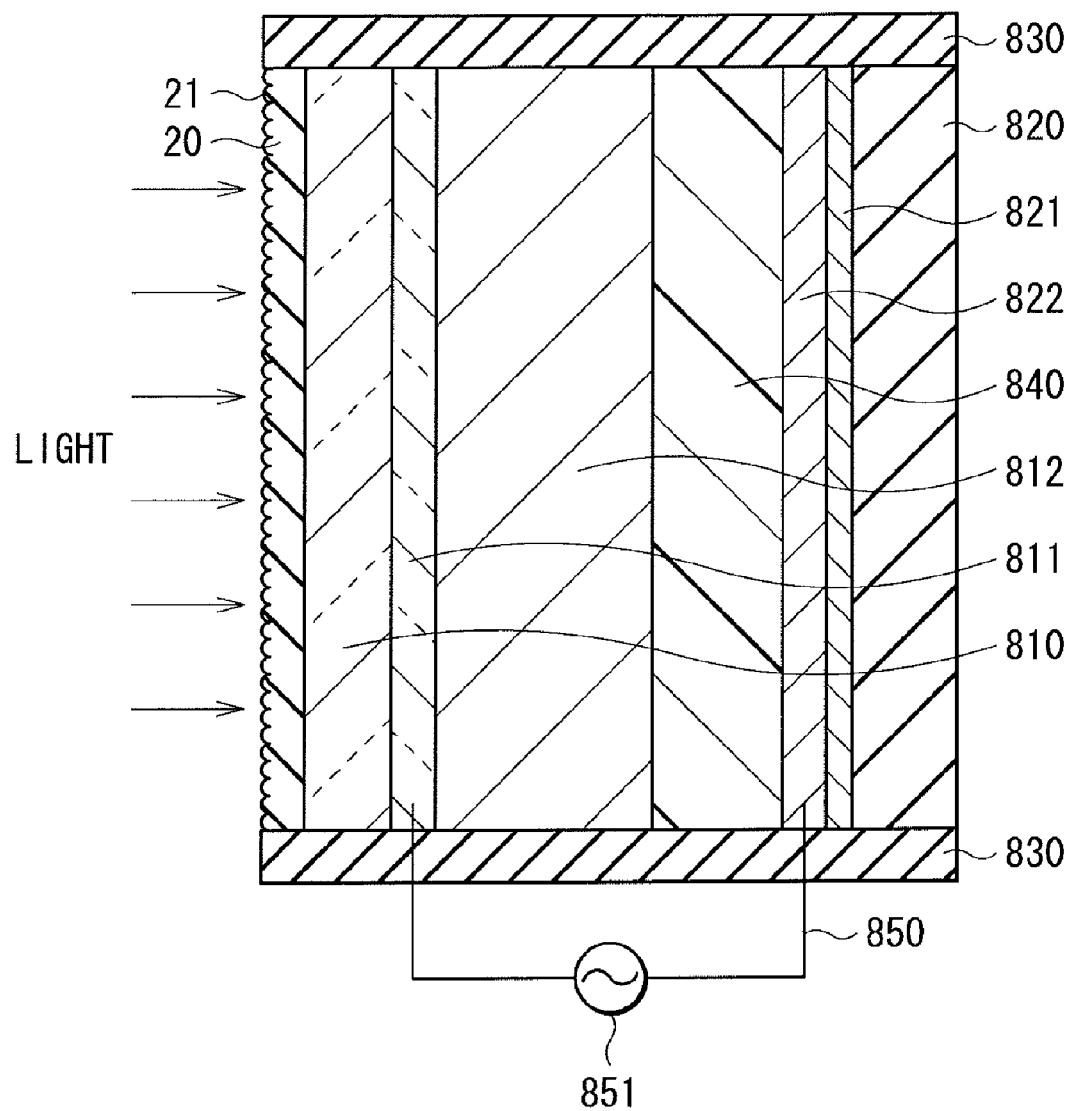
F I G. 31

OPTICALLY-FUNCTIONAL FILM AND METHOD OF MANUFACTURING THE SAME, DISPLAY AND METHOD OF MANUFACTURING THE SAME

CROSS REFERENCES TO RELATED APPLICATIONS

The present application claims priority to Japanese Priority Patent Application JP 2010-068123 filed in the Japan Patent Office on Mar. 24, 2010, the entire content of which is hereby incorporated by reference.

BACKGROUND

The present application relates to an optically-functional film suitable as a scattering film or the like for improving image quality of a display and a method of manufacturing the same. Moreover, the application relates to a display including the optically-functional film and a method of manufacturing the same.

An example of a display using a self-luminous element is a display using an organic light-emitting element (an organic EL (electroluminescence) element). However, in the display in related art, high directivity of EL light emission causes a decline in luminance depending on a viewing angle, thereby causing a color change such as color unevenness. Therefore, for example, as described in Published Japanese Translation No. 2008-515129 of PCT International Application, there is proposed a display including a binder or the like to which a scatterer is added between a protective film laid over a surface of an organic light-emitting element and an opposed substrate.

SUMMARY

However, in such a configuration in related art, there are possibilities of peeling due to adhesion failure in an interface with a protective film, deterioration of the protective film due to moisture diffusion from a binder absorbing water, and the like.

It is desirable to provide an optically-functional film allowed to prevent peeling due to adhesion failure or degradation due to moisture diffusion, and a method of manufacturing the same, and a display including the optically-functional film and allowed to prevent a decline in luminance and a color change depending on a viewing angle and a method of manufacturing the same.

According to an embodiment, there is provided an optically-functional film including the following components (A) and (B):

(A) an intermediate layer made of an insulating material including silicon and having silicon-containing particles therein or on a top surface thereof; and (B) an outermost layer made of the same material as that of the intermediate layer, whereas having a density higher than that of the intermediate layer, and having a bottom surface in contact with a top surface of the intermediate layer and a top surface with asperities.

In the optically-functional film according to the embodiment, as asperities are arranged on the top surface of the outermost layer, the asperities allow incident light which enters into the top surface of the outermost layer to be scattered.

According to an embodiment, there is provided a method of manufacturing an optically-functional film including the steps of: forming an intermediate layer made of an insulating material including silicon by a plasma CVD method; and forming an outermost layer by a plasma CVD method, the outermost layer arranged in contact with a top surface of the intermediate layer, made of the same material as that of the intermediate layer, whereas having a density higher than the intermediate layer, in which in the step of forming the intermediate layer, the generation of plasma is stopped, and then restarts during or after the formation of the intermediate layer to form silicon-containing particles in the intermediate layer or on a top surface of the intermediate layer, and the outermost layer is formed with use of the silicon-containing particles as nuclei to form asperities on a top surface thereof.

According to an embodiment, there is provided a display including: a display panel including an organic light-emitting element on a substrate; and an optically-functional film arranged on a light extraction side of the display panel, in which the optically-functional film is configured of the optically-functional film according to the above-described embodiment.

In the display according to the embodiment, the optically-functional film according to the above-described embodiment is arranged on a light extraction side of the display panel; therefore, the asperities allow incident light which enters into a top surface of the outermost layer to be scattered. Therefore, high directivity of EL light emission generated in the organic light-emitting element is released to prevent a decline in luminance depending on a viewing angle. Accordingly, a color change is prevented.

According to an embodiment, there is provided a first method of manufacturing a display including the steps of: forming a display panel with an organic light-emitting element on a substrate; and forming an optically-functional film on a surface of the organic light-emitting element, and the step of forming the optically-functional film is performed by the method of manufacturing an optically-functional film according to the above-described embodiment.

According to an embodiment, there is provided a second method of manufacturing a display including the steps of: forming a display panel with an organic light-emitting element on a substrate; forming an optically-functional film on a surface of a sealing panel; and arranging the optically-functional film of the sealing panel to face the organic light-emitting element of the display panel and entirely bonding the display panel and the sealing panel with an adhesive layer, and the step of forming the optically-functional film is performed by the method of manufacturing an optically-functional film according to the above-described embodiment.

In the optically-functional film according to the embodiment, as asperities are arranged on the top surface of the outermost layer, the asperities are allowed to have an optical function such as scattering, and unlike related art, it is not necessary to separately bond a binder to which a scatterer is added, and moisture diffusion from the binder is prevented, and peeling due to adhesion failure or deterioration due to moisture diffusion is preventable. When the display is configured with use of the optically-functional film, a decline in luminance depending on a viewing angle and a color change caused thereby are prevented; therefore, higher-quality display is achievable.

In the method of manufacturing an optically-functional film, and the first and second methods of manufacturing a display according to the embodiment, the generation of plasma is stopped, and then restarts during or after the formation of the intermediate layer to form the silicon-containing particles in the intermediate layer or on a top surface of the intermediate layer, and the outermost layer is formed with use of the silicon-containing particle as nuclei to form asperities on the top surface thereof; therefore, the optically-functional film or the display according to the embodiment is allowed to be manufactured easily.

Additional features and advantages are described herein, and will be apparent from the following Detailed Description and the figures.

BRIEF DESCRIPTION OF THE FIGURES

FIGS. 6A and 6B are sectional views illustrating a method of manufacturing the display illustrated in FIG. 3 in order of steps.

FIGS. 7A and 7B are sectional views illustrating steps following FIGS. 6A and 6B.

FIGS. 8A and 8B are sectional views illustrating steps following FIGS. 7A and 7B.

FIGS. 13A, 13B and 13C are sectional views illustrating steps following FIG. 12.

FIGS. 24A and 24B are sectional views illustrating steps following FIGS. 23A and 23B.

FIGS. 30A and 30B are a front view and a side view in a state in which Application Example 5 is opened, respectively, and FIGS. 30C, 30D, 30E, 30F and 30G are a front view, a left side view, a right side view, a top view and a bottom view in a state in which Application Example 5 is closed, respectively.

FIG. 31 is a sectional view illustrating a schematic configuration of a solar cell including the optically-functional film according to any of the above-described embodiments.

DETAILED DESCRIPTION

Embodiments of the present application will be described below in detail with reference to the drawings.

Descriptions will be given in the following order.
1. First Embodiment (An example in which an optically-functional film is arranged on a surface of an organic light-emitting element)
2. Second Embodiment (an example in which an optically-functional film is arranged on a sealing panel)
3. Application Examples (Application examples of display and application examples of optically-functional film)

First Embodiment

Figure 1:
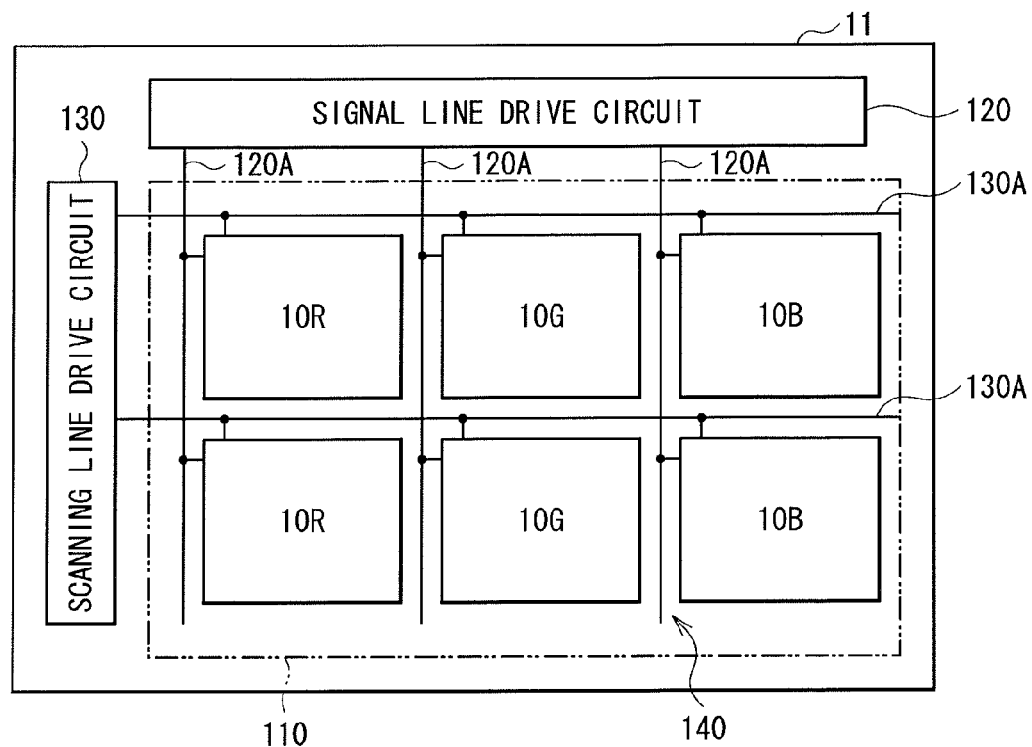
FIG. 1 is a diagram illustrating a configuration of a display according to a first embodiment.

FIG. 1 illustrates a configuration of a display according to a first embodiment. The display is used as an organic EL television or the like, and in the display, for example, a plurality of organic light-emitting elements 10R, 10G and 10B which will be described later are arranged in a matrix form as a display region 110 on a substrate 11. A signal line drive circuit 120 and a scanning line drive circuit 130 as drivers for picture display are arranged around the display region 110.

Figure 2:
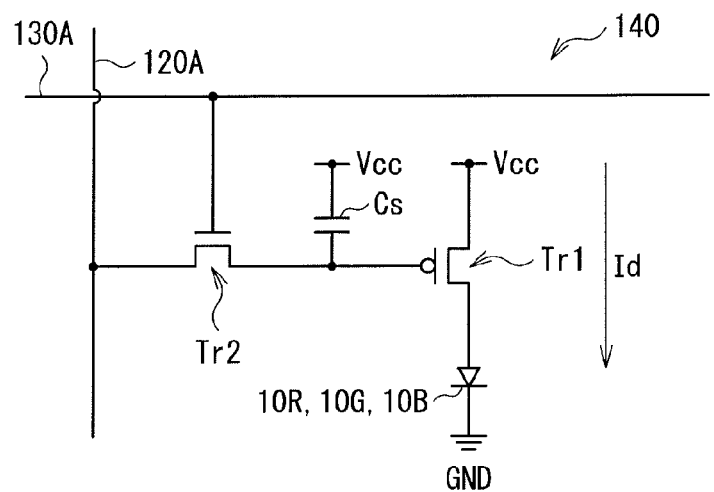
FIG. 2 is an equivalent circuit diagram illustrating an example of a pixel drive circuit illustrated in FIG. 1.

A pixel drive circuit 140 is arranged in the display region 110. FIG. 2 illustrates an example of the pixel drive circuit 140. The pixel drive circuit 140 is an active drive circuit formed below a first electrode 13 which will be described later. In other words, the pixel drive circuit 140 includes a driving transistor Tr1 and a writing transistor Tr2, a capacitor (retention capacitor) Cs between the driving transistor Tr1 and the writing transistor Tr2, and the organic light-emitting element 10R (or 10G or 10B) connected to the driving transistor Tr1 in series between a first power source line (Vcc) and a second power source line (GND). The driving transistor Tr1 and the writing transistor Tr2 each are configured of a typical thin film transistor (TFT), and the TFT may have, for example, an inverted staggered configuration (a so-called bottom gate type) or a staggered configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection between each signal line 120A and each scanning line 130A corresponds to one (a subpixel) of the organic light-emitting elements 10R, 10G and 10B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and a scanning signal is sequentially supplied from the scanning line drive circuit 130 to a gate electrode of the writing transistor Tr2 through the scanning line 130A.

Figure 3:
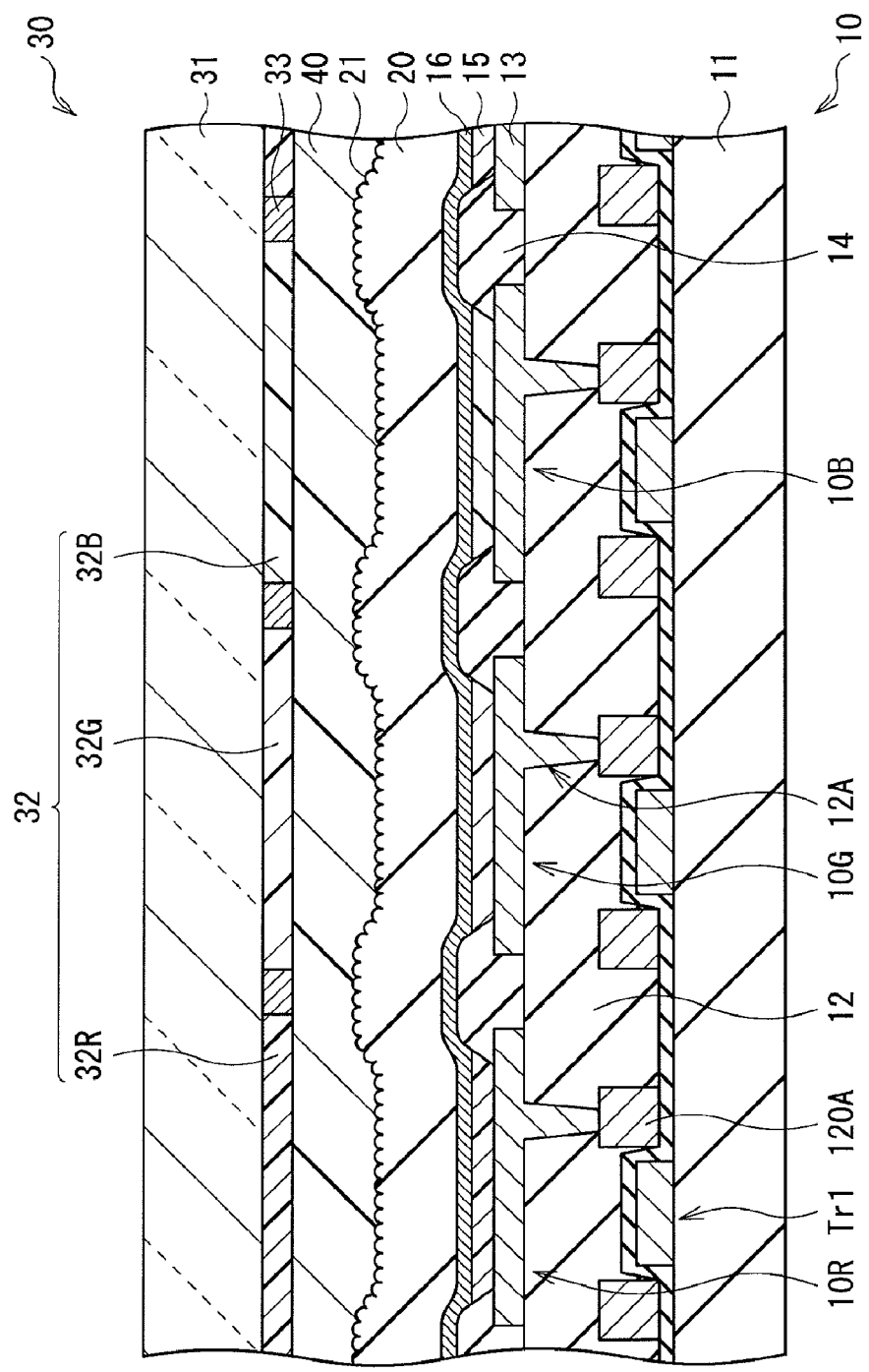
FIG. 3 is a sectional view illustrating a configuration of a display region of the display illustrated in FIG. 1.

FIG. 3 illustrates a sectional configuration of the display region 110 of the display illustrated in FIG. 1. The display includes an optically-functional film 20 on a light extraction side of a display panel 10. A sealing panel 30 is bonded to whole surfaces of the display panel 10 and the optically-functional film 20 with an adhesive layer 40.

The display panel 10 is configured by forming organic light-emitting elements 10R emitting red light, organic light-emitting elements 10G emitting green light and organic light-emitting elements 10B emitting blue light in order in a matrix as a whole on a substrate 11 made of glass, a silicon (Si) wafer, a resin or the like. Note that the organic light-emitting elements 10R, 10G and 10B each have a rectangular planar shape, and a combination of adjacent organic light-emitting elements 10R, 10G and 10B configures one pixel.

The organic light-emitting elements 10R, 10G and 10B each have a configuration in which the first electrode 13 as an anode, an insulating film 14, an organic layer 15 including a light-emitting layer which will be described later, and a second electrode 16 as a cathode are laminated in this order from the substrate 11 side with the above-described pixel drive circuit 140 and a planarization layer 12 in between.

The first electrodes 13 are formed so as to correspond to the organic light-emitting elements 10R, 10G and 10B, respectively, and are electrically separated from one another by the insulating film 14. Moreover, the first electrodes 13 have a function as a reflective electrode reflecting light emitted from the light-emitting layer, and it is desirable that the first electrodes 13 have as high reflectivity as possible so as to enhance light emission efficiency. The first electrodes 13 each have, for example, a thickness of 100 nm to 1000 nm both inclusive, more specifically a thickness of approximately 50 nm, and are made of aluminum (Al) or an alloy including aluminum (Al), or silver (Ag) or an alloy including silver (Ag). Moreover, the first electrodes 13 may be made of a simple substance or an alloy of any other metal element such as chromium (Cr), titanium (Ti), iron (Fe), cobalt (Co), nickel (Ni), molybdenum (Mo), copper (Cu), tantalum (Ta), tungsten (W), platinum (Pt) or gold (Au).

The insulating film 14 is provided to secure insulation between the first electrodes 13 and the second electrode 16 and to accurately have a desired shape of a light emission region, and is made of, for example, an organic material such as photosensitive acrylic, polyimide or polybenzoxazole or an inorganic insulating material such as silicon oxide ($SiO_2$). The insulating film 14 has openings corresponding to light emission regions of the first electrodes 13. Note that the organic layer 15 and the second electrode 16 may be continuously arranged on not only the light emission regions but also on the insulating film 14, but light is emitted only from the openings of the insulating film 14.

The organic layer 15 has, for example, a configuration in which a hole injection layer, a hole transport layer, the light-emitting layer and an electron transport layer are laminated in order from the first electrode 13 side, but any of these layers except for the light-emitting layer may be arranged as necessary. Moreover, the organic layer 15 may have a different configuration depending on colors of light emitted from the organic light-emitting elements 10R, 10G or 10B. The hole injection layer is provided to enhance hole injection efficiency, and is a buffer layer for preventing leakage. The hole transport layer is provided to enhance the hole transport efficiency to the light-emitting layer. The light-emitting layer emits light by the recombination of electrons and holes in response to the application of an electric field. The electron transport layer is provided to enhance electron transport efficiency to the light-emitting layer. In addition, an electron injection layer (not illustrated) made of LiF, $Li_2O$ or the like may be arranged between the electron transport layer and the second electrode 16.

Examples of the material of the hole injection layer of the organic light-emitting element 10R include 4,4'4"-tris(3-methylphenylphenylamino)triphenylamine (m-MTDATA) and 4,4'4"-tris(2-naphthylphenylamino)triphenylamine (2-TNATA). Examples of the material of the hole transport layer of the organic light-emitting element 10R include bis[(N-naphthyl)-N-phenyl]benzidine (α-NPD). Examples of the material of the light-emitting layer of the organic light-emitting element 10R include an 8-quinolinol aluminum complex (Alq3) mixed with 40 vol % of 2,6-bis[4-[N-(4-methoxyphenyl)-N-phenyl]aminostyryl]naphthalene-1,5-dicarbonitrile (BSN-BCN). Examples of the material of the electron transport layer of the organic light-emitting element 10R include Alq3.

Examples of the material of the hole injection layer of the organic light-emitting element 10G include m-MTDATA and 2-TNATA. Examples of the material of the hole transport layer of the organic light-emitting element 10G include α-NPD. Examples of the material of the light-emitting layer of the organic light-emitting element 10G include Alq3 mixed with 3 vol % of Coumarin 6. Examples of the material of the electron transport layer of the organic light-emitting element 10G include Alq3.

Examples of the material of the hole injection layer of the organic light-emitting element 10B include m-MTDATA and 2-TNATA. Examples of the material of the hole transport layer of the organic light-emitting element 10B include α-NPD. Examples of the material of the light-emitting layer of the organic light-emitting element 10B include spiro 6Φ. Examples of the material of the electron transport layer of the organic light-emitting element 10B include Alq3.

The second electrode 16 has, for example, a thickness of 5 nm to 50 nm both inclusive, and is made of a simple substance or an alloy of a metal element such as aluminum (Al), magnesium (Mg), calcium (Ca) or sodium (Na). In particular, the second electrode 16 is preferably made of an alloy of magnesium and silver (a MgAg alloy) or an alloy of aluminum (Al) and lithium (Li) (an AlLi alloy). Moreover, the second electrode 16 may be made of ITO (indium-tin complex oxide) or IZO (indium-zinc complex oxide).

The optically-functional film 20 has asperities 21 on an outermost surface thereof, and has a function as a scattering film scattering light emitted from the organic light-emitting elements 10R, 10G and 10B or outside light entering from the sealing panel 30. Moreover, the optically-functional film 20 is made of an insulating material including silicon such as silicon nitride (SiN), silicon oxide ($SiO_2$) or silicon oxynitride (SiON), and also has a function as a protective film protecting the organic light-emitting elements 10R, 10G and 10B. The optically-functional film 20 is arranged on surfaces of the organic light-emitting elements 10R, 10G and 10B throughout the display region 110, and has, for example, a thickness of a few hundreds of nm to 10000 nm both inclusive.

Figure 4:
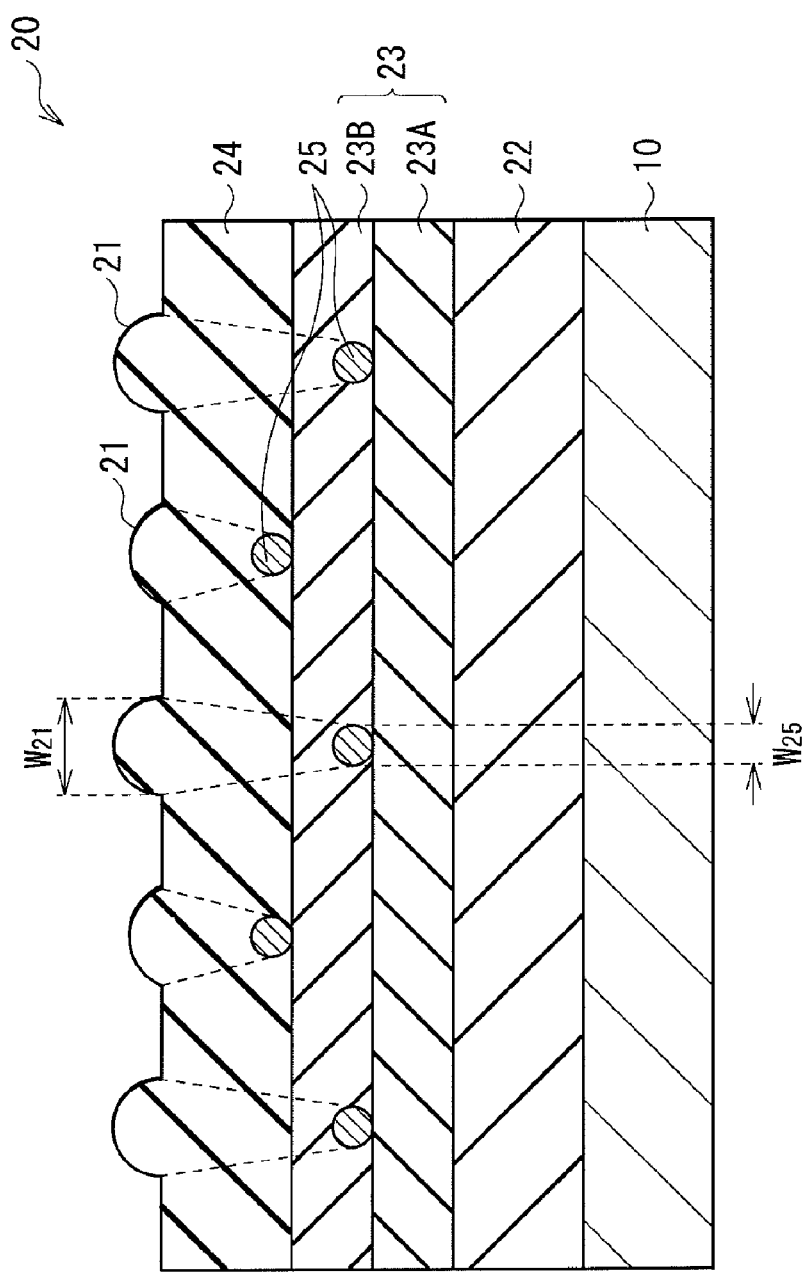
FIG. 4 is an enlarged sectional view illustrating an optically-functional film illustrated in FIG. 3.
Figure 5:
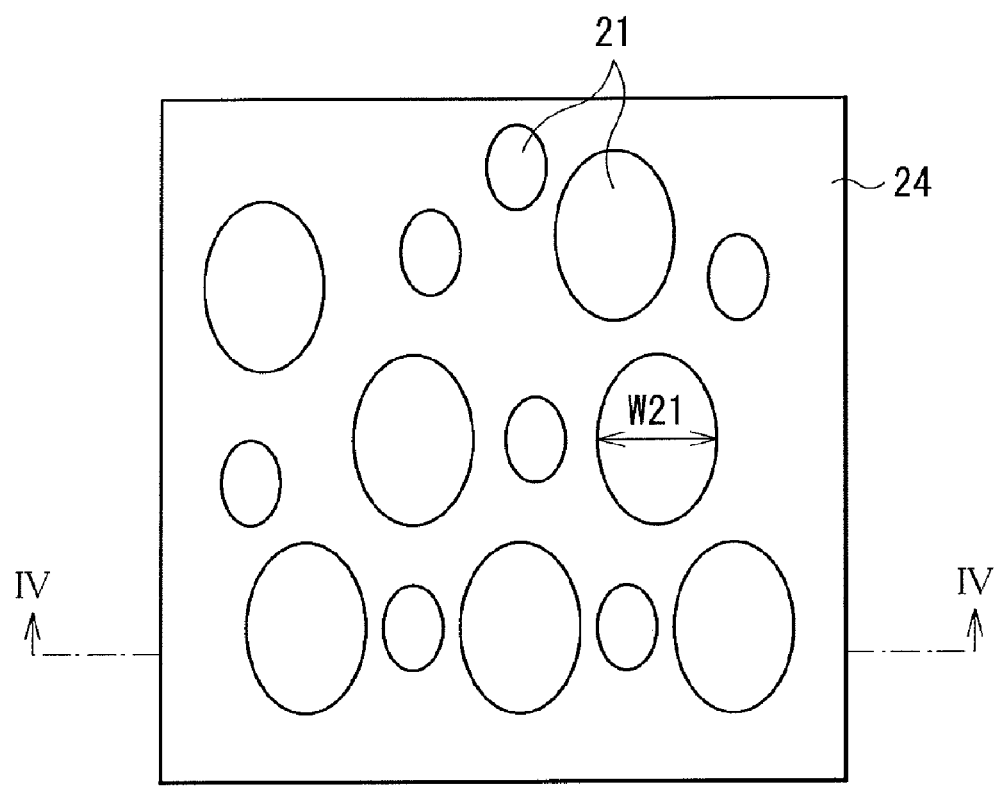
FIG. 5 is a plan view of the optically-functional film illustrated in FIG. 4.

FIGS. 4 and 5 illustrate an enlarged sectional view and an enlarged plan view of a part of the optically-functional film 20 illustrated in FIG. 3. The optically-functional film 20 has, for example, a three-layer configuration including a lower layer 22 made of high-density silicon nitride, an intermediate layer 23 made of low-density silicon nitride and an outermost layer 23 made of high-density silicon nitride in order from the display panel 10 side. Herein, "high-density" means higher film density than that of the intermediate layer 23, and "low-density" means lower film density than that of the outermost layer 24 or the lower layer 22. Moreover, for example, a difference in film density between the high-density outermost layer 24 or the high-density lower layer 22 and the low-density intermediate layer 24 is preferably $0.4 \times 10^{22}$ (atoms/cm3) or over.

For example, the film densities of the high-density outermost layer 24 and the high-density lower layer 22 are preferably $6.2 \times 10^{22}$ (atoms/cm3) or over, because higher film density allows a further reduction in a humidity permeability coefficient, thereby allowing an improvement in sealing characteristics (passivation characteristics). More specifically, in the case where the film densities of the outermost layer 24 and the lower layer 22 are $6.2 \times 10^{22}$ (atoms/cm3) or over, the humidity permeability coefficient may be reduced to smaller than $8.0 \times 10^{-4}$ (g·mm/m2·d). Note that the film density of the outermost layer 24 and the film density of the lower layer 22 are not necessarily equal to each other.

On the other hand, for example, the film density of the low-density intermediate layer 23 is preferably $5.8 \times 10^{22}$ (atoms/cm3) or less. In this case, the humidity permeability coefficient of the intermediate layer 23 is, for example, $8.0 \times 10^{-4}$ (g·mm/m2·d) or over.

The lower layer 22 is in contact with a bottom surface of the intermediate layer 23, and is arranged directly above the second electrode 16 to protect the organic light-emitting elements 10R, 10G and 10B by directly covering the organic light-emitting elements 10R, 10G and 10B with the intermediate layer 23. As described above, the lower layer 22 is made of high-density silicon nitride with high sealing characteristics. The lower layer 22 has, for example, a thickness of approximately 1000 nm.

As described above, the intermediate layer 23 is made of low-density silicon nitride. Therefore, in manufacturing steps which will be described later, the coverage of a side wall of a projection on a surface of the display panel 10 is allowed to be increased, and the occurrence of a defect such as dark spot is preventable. The intermediate layer 23 has, for example, a thickness of a few hundreds of nm to a few thousands of nm.

A bottom surface of the outermost layer 24 is in contact with a top surface of the intermediate layer 23, and, as described above, the outermost layer 24 is made of high-density silicon nitride. Therefore, in the manufacturing steps which will be described later, the adhesion of a foreign substance to a top surface of the outermost layer is preventable, and film quality is allowed to be improved. For example, the outermost layer 24 has a thickness of approximately 1000 nm.

The intermediate layer 23 has silicon-containing particles 25 therein or on the top surface thereof. The outermost layer 24 has asperities 21 on the top surface thereof. Therefore, in the optically-functional film 20, peeling due to adhesion failure or deterioration due to moisture diffusion is preventable, and a decline in luminance and a color change depending on a viewing angle of a display are preventable.

The asperities 21 are minute asperities configured of hemispherical or substantially hemispherical curved surfaces formed in the top surface of the outermost layer 24 (that is, an outermost surface of the optically-functional film 20), and as described above, the asperities 21 function as scatterers in the optically-functional film 20. The width (diameter) W21 of each of the asperities 21 is, for example, within a range of approximately 0.5 μm to 5 μm. Such asperities 21 are formed by growing the outermost layer 24 from the silicon-containing particles 25 as nuclei in a manufacturing step which will be described later, and are positioned directly above the silicon-containing particles 25. Note that dotted lines in the drawing indicate only a positional correspondence relationship between the silicon-containing particles 25 and the asperities 21, and do not indicate that grain boundaries or columnar particles indicated by dotted lines are formed.

The silicon-containing particles 25 are silicon-based particles produced when the intermediate layer 23 is formed by a plasma CVD (Chemical Vapor Deposition) method in a manufacturing step which will be described later. The silicon-containing particles 25 include silicon (Si) as a main component, and nitrogen (N), carbon (C), oxygen (O) or the like. The size (diameter) W25 of each of the silicon-containing particles 25 is, for example, approximately 0.2 μm.

The intermediate layer 23 includes, for example, two layers, that is, a first intermediate layer 23A and a second intermediate layer 23B in order from the display panel 10 side. The silicon-containing particles 25 in the intermediate layer 23 are positioned on a boundary surface between the first intermediate layer 23A and the second intermediate layer 23B. The silicon-containing particles 25 on the top surface of the intermediate layer 23 are positioned on a top surface of the second intermediate layer 23B. Note that the intermediate layer 23 may have a laminate configuration including three or more layers.

The sealing panel 30 illustrated in FIG. 3 is arranged on a light extraction side, that is, the second electrode 16 side of the display panel 10, and includes a color filter 32 and a light-shielding film 33 as a black matrix on a surface of a transparent sealing substrate 31.

The sealing substrate 31 is configured of, for example, glass, a resin substrate or a resin film made of a heat-resistant resin, or fused silica.

The color filter 32 and the light-shielding film 33 extract light emitted from the organic light-emitting elements 10R, 10G and 10B, and absorb outside light reflected from the organic light-emitting elements 10R, 10G and 10B and wiring therebetween, thereby improving contrast.

The color filter 32 includes red filters 32R, green filters 32G and blue filters 32B which are arranged in order so as to correspond to the organic light-emitting elements 10R, 10G and 10B, respectively. The red filters 32R, the green filters 32G and the blue filters 32B have, for example, a rectangular shape, and are formed without space. The red filters 32R, the green filters 32G and the blue filters 32B are made of a resin mixed with a pigment of a corresponding color, and are adjusted by selecting the pigment so that light transmittance in a target red, green or blue wavelength range is high and light transmittance in other wavelength ranges is low.

The light-shielding film 33 is arranged along boundaries of the red filters 32R, the green filters 32G and the blue filters 32B. The light-shielding film 33 is configured of, for example, a black resin film mixed with a black colorant with an optical density of 1 or over, or a thin-film filter using interference of a thin film. In particular, the light-shielding film 33 is preferably configured of the black resin film, because the light-shielding film 33 is easily formed at low cost. The thin-film filter is formed, for example, by laminating one or more thin films made of metal, a metal nitride or a metal oxide, and uses interference of the thin film to attenuate light. More specifically, as the thin-film filter, a thin-film filter formed by alternately laminating chromium and chromium (III) oxide ($Cr_2O_3$) is used. Note that the light-shielding film 33 is not necessarily provided.

The adhesive layer 40 illustrated in FIG. 3 is made of a thermosetting resin, an ultraviolet curable resin or the like. The above-described optically-functional film 20 is in a clouded (frosted glass) state by the asperities 21 on the outermost surface thereof, but when gaps between the asperities 21 are filled with the resin of the adhesive layer 40, the optically-functional film 20 becomes transparent. The refractive indices n1, n2 and n3 of the lower layer 22, the intermediate layer 23 (the first intermediate layer 23A and the second intermediate layer 23B) and the outermost layer 24 of the optically-functional film 20 are, for example, within a range of approximately 1.60 to 1.95. On the other hand, the refractive index n4 of the adhesive layer 40 is, for example, 1.57 or less.

The display is allowed to be manufactured by, for example, the following steps.

Step of Forming Display Panel 10

First, as illustrated in FIG. 6A, the pixel drive circuit 140 is formed on the substrate 11 made of the above-described material.

Next, as illustrated in FIG. 6B, the planarization layer 12 made of, for example, a photosensitive polyimide is formed on a whole surface of the substrate 11 by, for example, a spin coating method, and is patterned into a predetermined shape by exposure to light and development to form connection holes 12A, and then the planarization layer 12 is fired.

Next, as illustrated in FIG. 7A, the first electrodes 13 made of, for example, the above-described material with the above-described thickness are formed on the planarization layer 12 by, for example, a sputtering method, and then the first electrodes 13 are patterned into a predetermined shape by, for example, a lithography technique and etching. Thus, a plurality of first electrodes 13 are formed on the planarization layer 12.

After that, as illustrated in FIG. 7B, the whole surface of the substrate 11 is coated with a photosensitive resin, and openings are formed in the photosensitive resin by exposure to light and development, and then the photosensitive resin is fired to form the insulating film 14.

Next, as illustrated in FIG. 8A, the hole injection layer, the hole transport layer, the light-emitting layer and the electron transport layer, which are made of the above-described materials, of the organic light-emitting element 10R are formed in order by, for example, a vacuum deposition method so as to form the organic layer 15 of the organic light-emitting element 10R. After that, also as illustrated in FIG. 8A, as in the case of the organic layer 15 of the organic light-emitting element 10R, the hole injection layer, the hole transport layer, the light-emitting layer and the electron transport layer, which are made of the above-described materials, of the organic light-emitting element 10G are formed in order to form the organic layer 15 of the organic light-emitting element 10G. Next, also as illustrated in FIG. 8A, as in the case of the organic layer 15 of the organic light-emitting element 10R, the hole injection layer, the hole transport layer, the light-emitting layer and the electron transport layer, which are made of the above-described materials, of the organic light-emitting element 10B are formed in order to form the organic layer 15 of the organic light-emitting element 10B.

After the organic layers 15 of the organic light-emitting elements 10R, 10G and 10B are formed, as illustrated in FIG. 8B, the second electrode 16 made of the above-described material with the above-described thickness is formed on the whole surface of the substrate 11 by, for example, an evaporation method. Thus, the organic light-emitting elements 10R, 10G and 10B illustrated in FIG. 3 are formed.

Step of Forming Optically-Functional Film 20 on Light Extraction Side of Display Panel 10

Figure 9A:
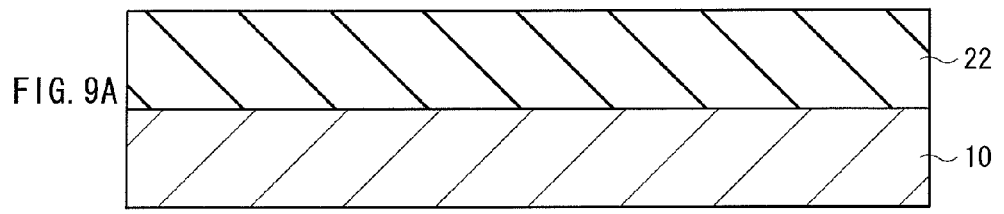
FIGS. 9A and 9B are sectional views illustrating steps following FIGS. 8A and 8B.

After the display panel 10 is formed, as illustrated in FIG. 9A, the lower layer 22 made of, for example, high-density silicon nitride with a thickness of approximately 1000 nm is formed on surfaces of the organic light-emitting elements 10R, 10G and 10B of the display panel 10 by, for example, a plasma CVD method.

The control of the film densities of the lower layer 22, the intermediate layer 23 and the outermost layer 24 will be described below. The film density of silicon nitride forming the lower layer 22, the intermediate layer 23 and the outermost layer 24 is controllable by film formation conditions of a CVD method. More specifically, film formation by the CVD method proceeds by a surface reaction in a film formation surface and a gas phase reaction in a film formation atmosphere. At this time, for example, when the flow rate of a material gas is increased to increase gas phase reactions, the film formation rate is accelerated, and the film density is reduced. On the other hand, when the flow rate of the material gas is reduced to increase the surface reactions, the film formation rate is slowed, and the film density is increased.

In the case where the lower layer 22, the intermediate layer 23 and the outermost layer 24 are made of silicon nitride, as the material gas, for example, an ammonia ($NH_3$) gas and a silane ($SiH_4$) gas are used. Therefore, when the total flow rate of the ammonia gas and the silane gas is adjusted, the film densities of the lower layer 22, the intermediate layer 23 and the outermost layer 24 are controllable.

Therefore, the lower layer 22 and the outermost layer 24 made of high-density silicon nitride are formed by a CVD method with a relatively low film formation rate at which surface reactions mainly take place. On the other hand, the intermediate layer 23 made of low-density silicon nitride is formed by a CVD method with a higher film formation rate than that in the case of the lower layer 22 and the outermost layer 24 at which gas phase reactions mainly take place.

The gas phase reactions and the surface reactions in the CVD film formation are controllable by not only the above-described flow rate of the material gases but also, for example, a substrate temperature or gas pressure in a film formation atmosphere. For example, when the substrate temperature is decreased to form a film under a low temperature ranging from room temperature to 150° C. both inclusive, or when the gas pressure in the film formation atmosphere is increased, gas phase reactions are increased, and the film formation rate is accelerated, and the film density is reduced.

Figure 10:
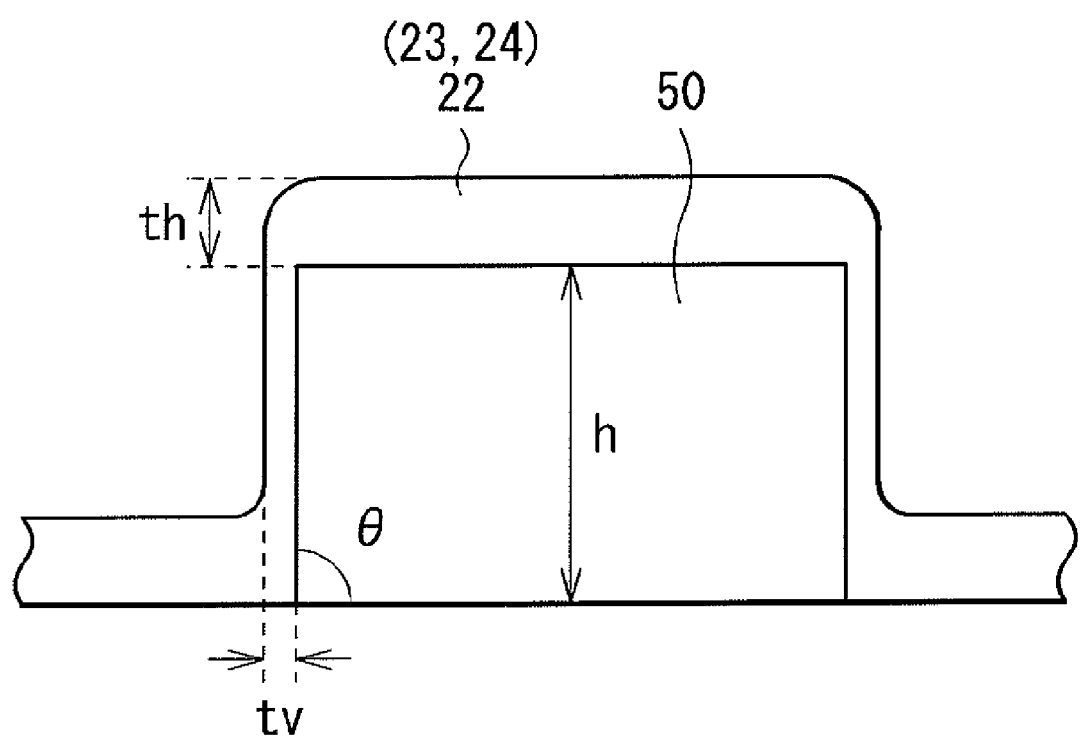
FIG. 10 is an illustration for describing coverage of a side wall of a projection.

Moreover, in the film formation by such a CVD method, the coverage of the side wall of the projection differs depending on film formation conditions. More specifically, a lower-density film formed mainly by gas phase reactions has a higher coverage of the side wall of the projection. As described above, when the film density of the low-density intermediate layer 23 is $5.8 \times 10^{22}$ (atoms/cm3) or less, as illustrated in FIG. 10, the coverage (a top surface film thickness th/a side wall film thickness tv) th/tv of a side wall of a projection 50 is allowed to be th/tv≧⅔. On the other hand, when the film densities of the outermost layer 24 and the lower layer 22 are $6.2 \times 10^{22}$ (atoms/cm3) or over, the coverage of the side wall of the projection 50 is th/tv<⅔. As illustrated in FIG. 10, the coverage of the side wall of the projection 50 herein is the coverage of the projection 50 with a tapered angle θ=90° and a height h=1 μm.

In addition, in the foregoing CVD film formation, in the case where the film formation is completed at a high film formation rate at which gas phase reactions mainly take place, a foreign substance with a size of 50 nm to 300 nm is easily adhered on a film surface. Therefore, the outermost surface of the optically-functional film 20 is configured of the outermost layer 24 of high-density silicon nitride formed at a relatively low film formation rate at which surface reactions mainly take place.

Figure 9B:
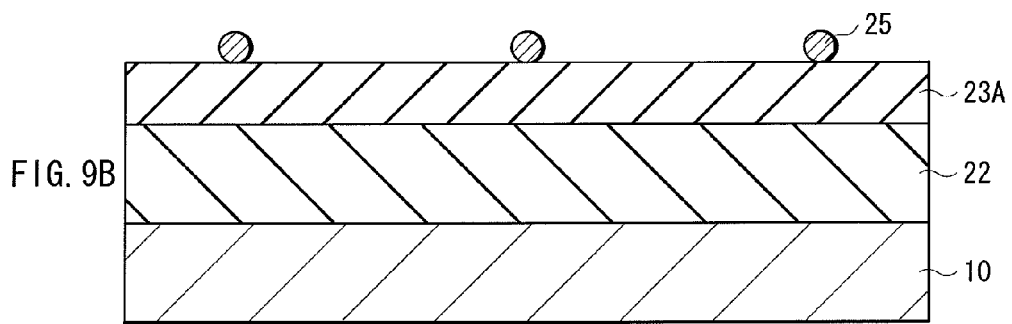

After the lower layer 22 is formed, as illustrated in FIG. 9B, the first intermediate layer 23A made of, for example, silicon nitride is formed by, for example, a plasma CVD method. At this time, for example, when the total flow rate of the ammonia gas and the silane gas as material gases is increased, and the film formation is performed under a low temperature ranging from room temperature to 150° C. both inclusive, gas phase reactions are increased to accelerate the film formation rate, thereby allowing the first intermediate layer 23A to be formed of low-density silicon nitride.

After the first intermediate layer 23A is formed, the generation of plasma is stopped, and then restarts. Thus, the silicon-containing particles 25 are formed on the top surface of the first intermediate layer 23A.

The principle of the formation of such silicon-containing particles 25 is considered as follows. When film formation is performed in a state where the total flow rate of the ammonia gas and the silane gas as material gases is high, and in particular, in a state where the flow rate of the silane gas is excessive, an excessive amount of unreacted silicon radical nanoparticles is formed in a gas phase. Moreover, when film formation is performed under a low temperature ranging from room temperature to 150° C. both inclusive, more preferably at a low temperature of 100° C. or less, thermal decomposition of a silicon radical is prevented. Further, a volume area where the silane gas is excessive is formed with use of a narrow-gap plasma. Therefore, silicon radical nanoparticles are formed rapidly, and the shapes of the silicon radical nanoparticles are maintained to some extent.

After that, when a plasma discharge is stopped to turn a potential off, a balance between the potential and gravity is lost, and the silicon radical nanoparticles are dropped by gravity to adhere silicon radical species to the top surface of the first intermediate layer 23A.

Next, the generation of plasma restarts, and plasma processing with an inert gas such as N2 is performed to stabilize adhesion. Therefore, the silicon radical species deposited on the top surface of the first intermediate layer 23A are condensed or combined to form the silicon-containing particles 25 with a reduced surface potential.

Figure 11A:
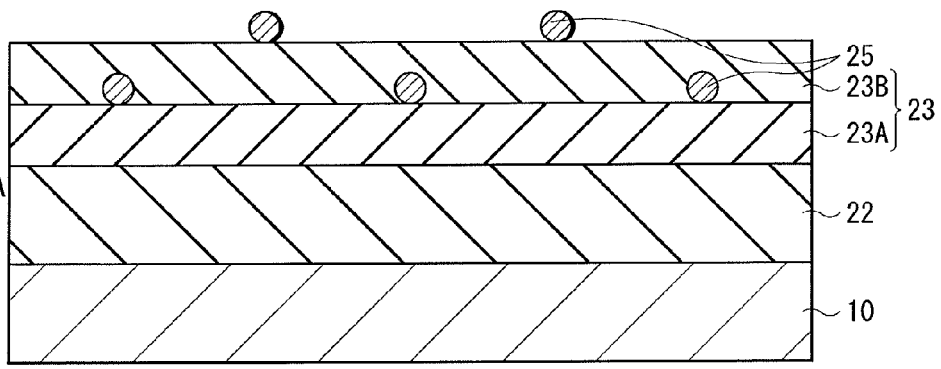
FIGS. 11A and 11B are sectional views illustrating steps following FIGS. 9A and 9B.

After the silicon-containing particles 25 are formed, as illustrated in FIG. 11A, the second intermediate layer 23B made of, for example, silicon nitride is formed by, for example, a plasma CVD method. At this time, as in the case of the first intermediate layer 23A, for example, when the total flow rate of the ammonia gas and the silane gas is increased and film formation is performed under a low temperature ranging from room temperature to 150° C. both inclusive, gas phase reactions are increased to accelerate the film formation rate, thereby allowing the second intermediate layer 23B to be formed of low-density silicon nitride.

After the second intermediate layer 23B is formed, the generation of plasma is stopped, and then restarts. Therefore, as in the case of the first intermediate layer 23A, the silicon-containing particles 25 are formed on the top surface of the second intermediate layer 23B. Thus, the intermediate layer 23 including the silicon-containing particles 25 therein (on a boundary surface between the first intermediate layer 23A and the second intermediate layer 23B) and on the top surface thereof (on the top surface of the second intermediate layer 23B) is formed.

Figure 11B:
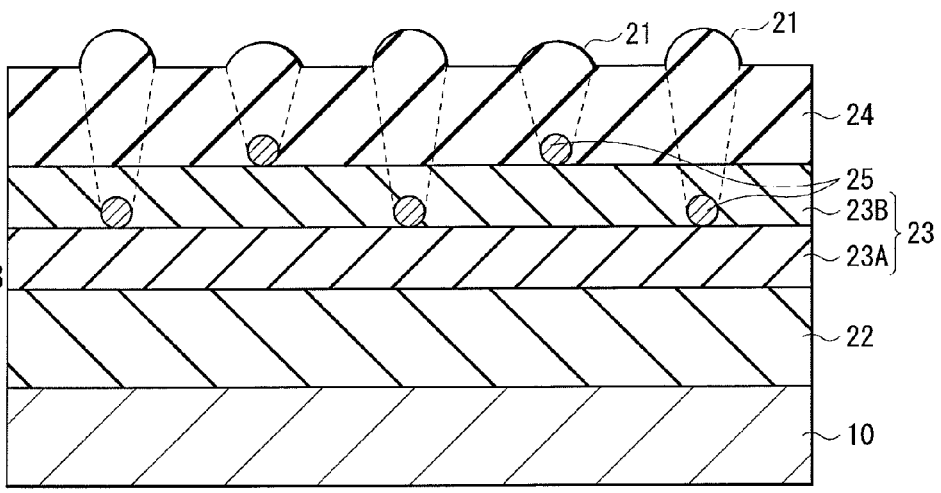
Figure 12:
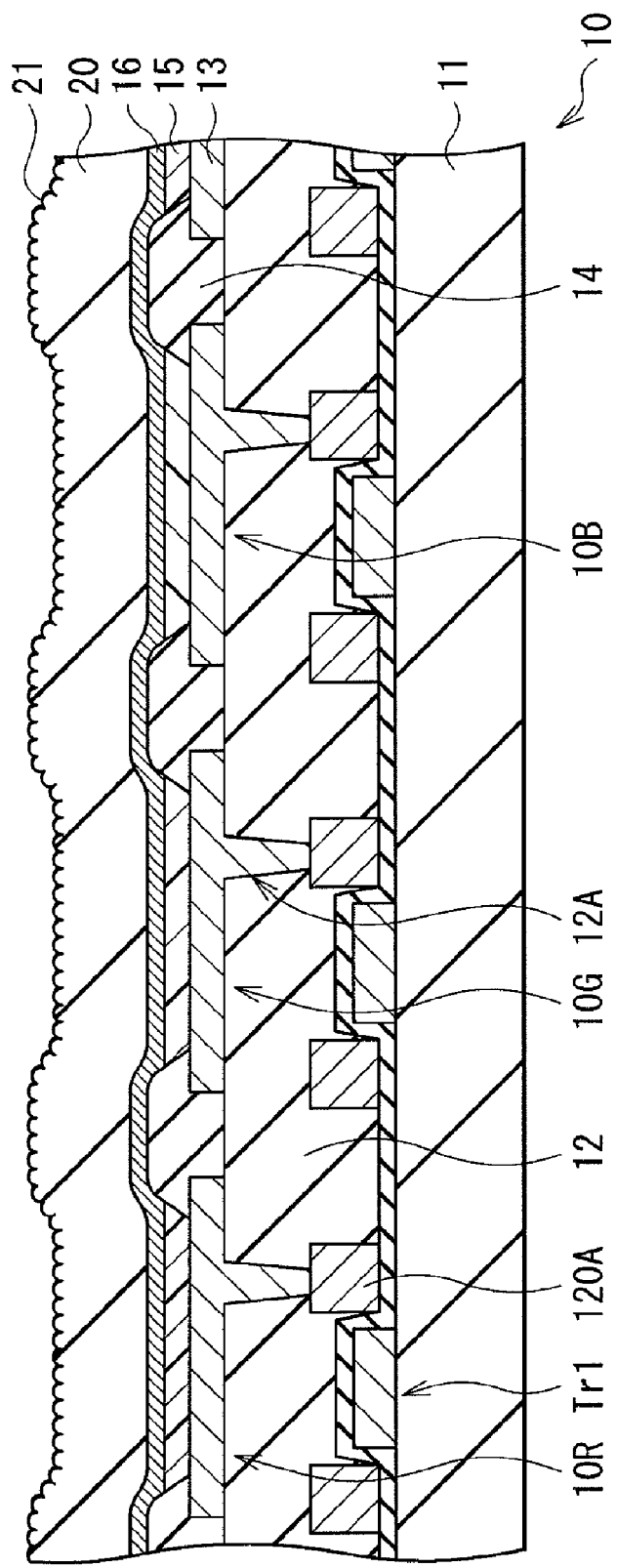
FIG. 12 is a sectional view illustrating a step following FIGS. 11A and 11B.

After the intermediate layer 23 is formed, as illustrated in FIG. 11B, the outermost layer 24 made of, for example, high-density silicon nitride is formed by, for example, a plasma CVD method. The outermost layer 24 is formed by growth from the silicon-containing particles 25 as nuclei to form the asperities 21 on the top surface thereof. Thus, as illustrated in FIG. 12, the optically-functional film 20 having asperities 21 on the outermost surface thereof is formed.

Step of Forming Sealing Panel 30

Moreover, the sealing panel 30 is formed. First, as illustrated in FIG. 13A, the light-shielding film 33 made of the above-described material is formed on the sealing substrate 31 made of the above-described material, and the light-shielding film 33 is patterned into a predetermined shape. Next, as illustrated in FIG. 13B, the material of the red filters 32R is applied to the sealing substrate 31 by spin coating or the like, and the material is patterned by a photolithography technique and fired to form the red filters 32R. At the time of patterning, edge parts of the red filters 32R may be laid over the light-shielding film 33. Next, as illustrated in FIG. 13C, as in the case of the red filters 32R, the blue filters 32B and the green filters 32G are formed in order. Thus, the sealing panel 30 including the color filter 32 and the light-shielding film 33 is formed on the surface of the sealing substrate 31.

Step of Bonding Display Panel 10 and Sealing Panel 30

After the display panel 10, the optically-functional film 20 and the sealing panel 30 are formed, the sealing panel 30 is arranged so as to face the organic light-emitting elements 10R, 10G and 10B of the display panel 10, and the sealing panel 30 is bonded to a whole surface of the display panel 10 with the adhesive layer 40. Thus, the display illustrated in FIGS. 1 to 3 is completed.

Figure 14:
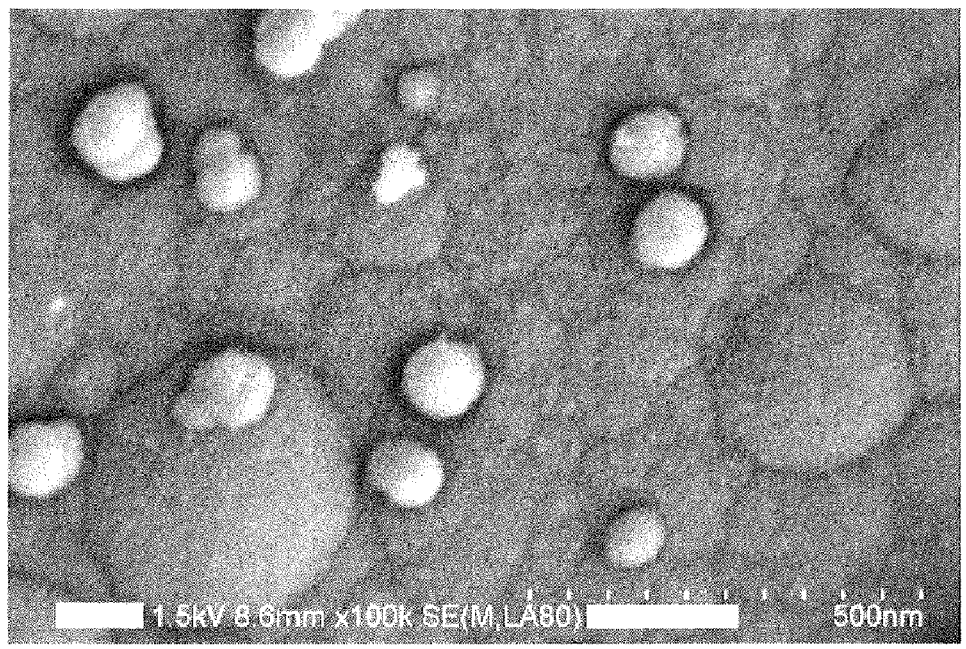
FIG. 14 is a photograph of silicon-containing particles illustrated in FIG. 11A.
Figure 15:
FIG. 15 is a photograph of asperities on a top surface of an outermost layer illustrated in FIG. 11B.

In addition, when the optically-functional film 20 made of silicon nitride was actually formed on a glass plate by the above-described manufacturing method and the state of the top surface of the intermediate layer 23 was examined after the formation thereof, as illustrated in FIG. 14, it was confirmed that a large number of silicon-containing particles 25 were formed. Next, when the state of a top surface of the outermost layer 24 was examined after the formation thereof, as illustrated in FIG. 15, it was confirmed that a large number of asperities 21 were formed. In other words, it was confirmed that by the manufacturing method according to the embodiment, the silicon-containing particles 25 were allowed to be formed in the intermediate layer 23 or on the top surface of the intermediate layer 23, and the asperities 21 were allowed to be formed on the top surface of the outermost layer 24.

In the display, a scanning signal is supplied from the scanning line drive circuit 130 to each pixel through a gate electrode of the writing transistor Tr2, and an image signal supplied from the signal line drive circuit 120 through the writing transistor Tr2 is retained in the retention capacitor Cs. In other words, on/off control of the driving transistor Tr1 is performed in response to the signal retained in the retention capacitor Cs, and a drive current Id is thereby injected into each of the organic light-emitting elements 10R, 10G and 10B to emit light by the recombination of holes and electrons. The light passes through the second electrode 16, the optically-functional film 20, the adhesive layer 40, the color filter 32 and the sealing substrate 31 to be extracted.

Figure 16:
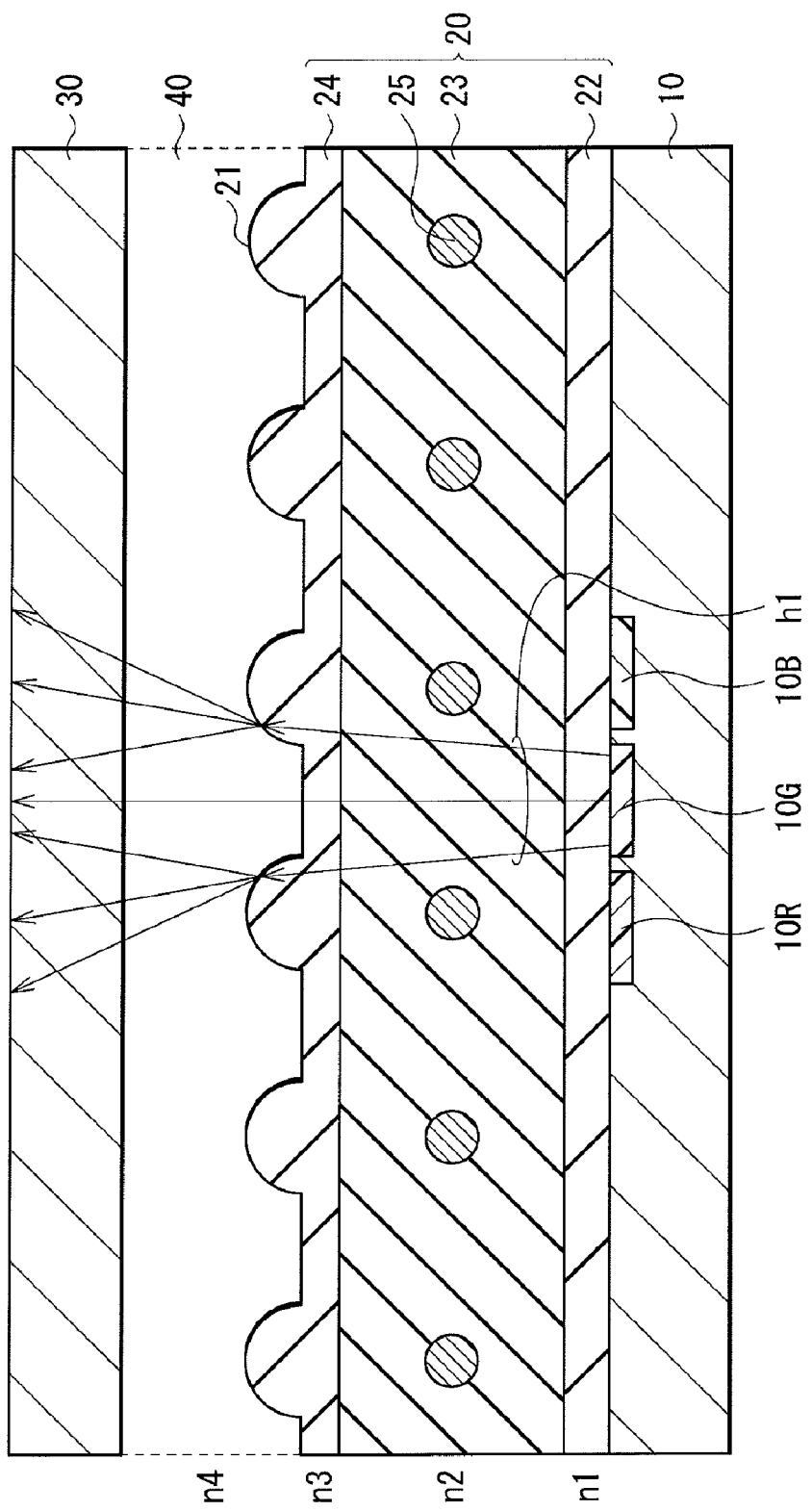
FIG. 16 is a sectional view for describing a function at the time of light emission of the optically-functional film illustrated in FIG. 4.

In this case, the optically-functional film 20 having asperities 21 on the outermost surface thereof is arranged on the light extraction side of the display panel 10; therefore, as illustrated in FIG. 16, light h1 emitted from the organic light-emitting elements 10R, 10G and 10B enters into the top surface of the outermost layer 24, and is scattered by the asperities 21. Therefore, high directivity of EL light emission generated in the organic light-emitting elements 10R, 10G and 10B is released to prevent a decline in luminance and a color change depending on a viewing angle.

Figure 17:
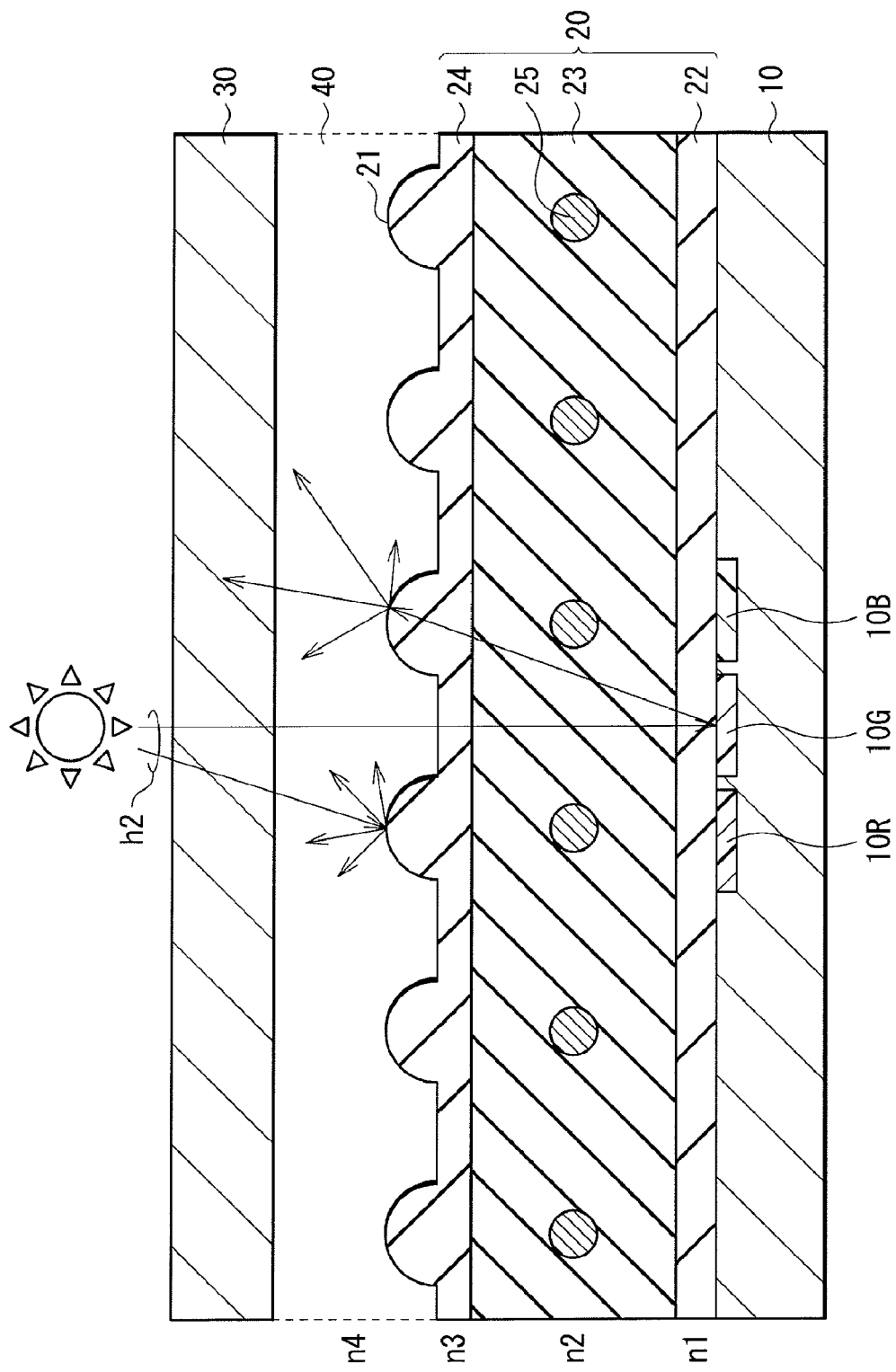
FIG. 17 is a sectional view for describing a function at the time of non-light emission of the optically-functional film illustrated in FIG. 4.

Moreover, in the embodiment, while the organic light-emitting elements 10R, 10G and 10B do not emit light, as illustrated in FIG. 17, in the case where outside light h2 is reflected from the first electrodes 13 or the second electrode 16 of the organic light-emitting elements 10R, 10G and 10B, the reflected light enters into the top surface of the outermost layer 24 to be scattered by asperities 21. Moreover, in the case where the outside light h2 directly enters into the top surface of the outermost layer 24, the outside light h2 is scattered by the asperities 21. Therefore, the pattern of the first electrodes 13 or the second electrode 16 is prevented from being reflected on the sealing substrate 31 to cause picture unevenness.

Figure 18:
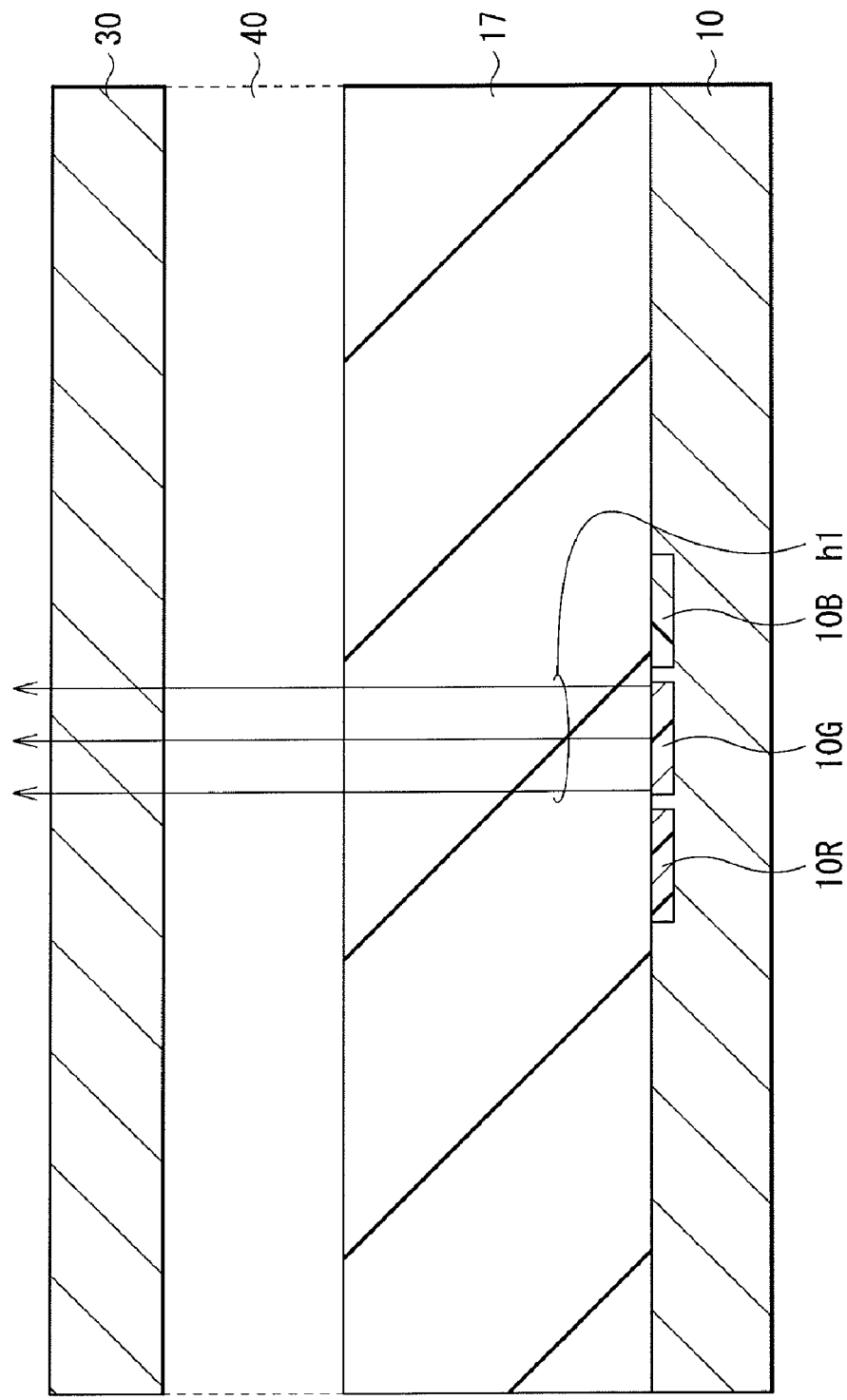
FIG. 18 is a sectional view for describing a function at the time of light emission of a protective film in related art.

On the other hand, in related art, while the organic light-emitting elements 10R, 10G and 10B emit light, as illustrated in FIG. 18, as asperities are not arranged on the outermost surface of a protective film 17, by high directivity of EL light emission generated in the organic light-emitting elements 10R, 10G and 10B, luminance when viewed from a front side is increased, but on the other hand, light emission luminance is reduced depending on a viewing angle to cause a color change.

Figure 19:
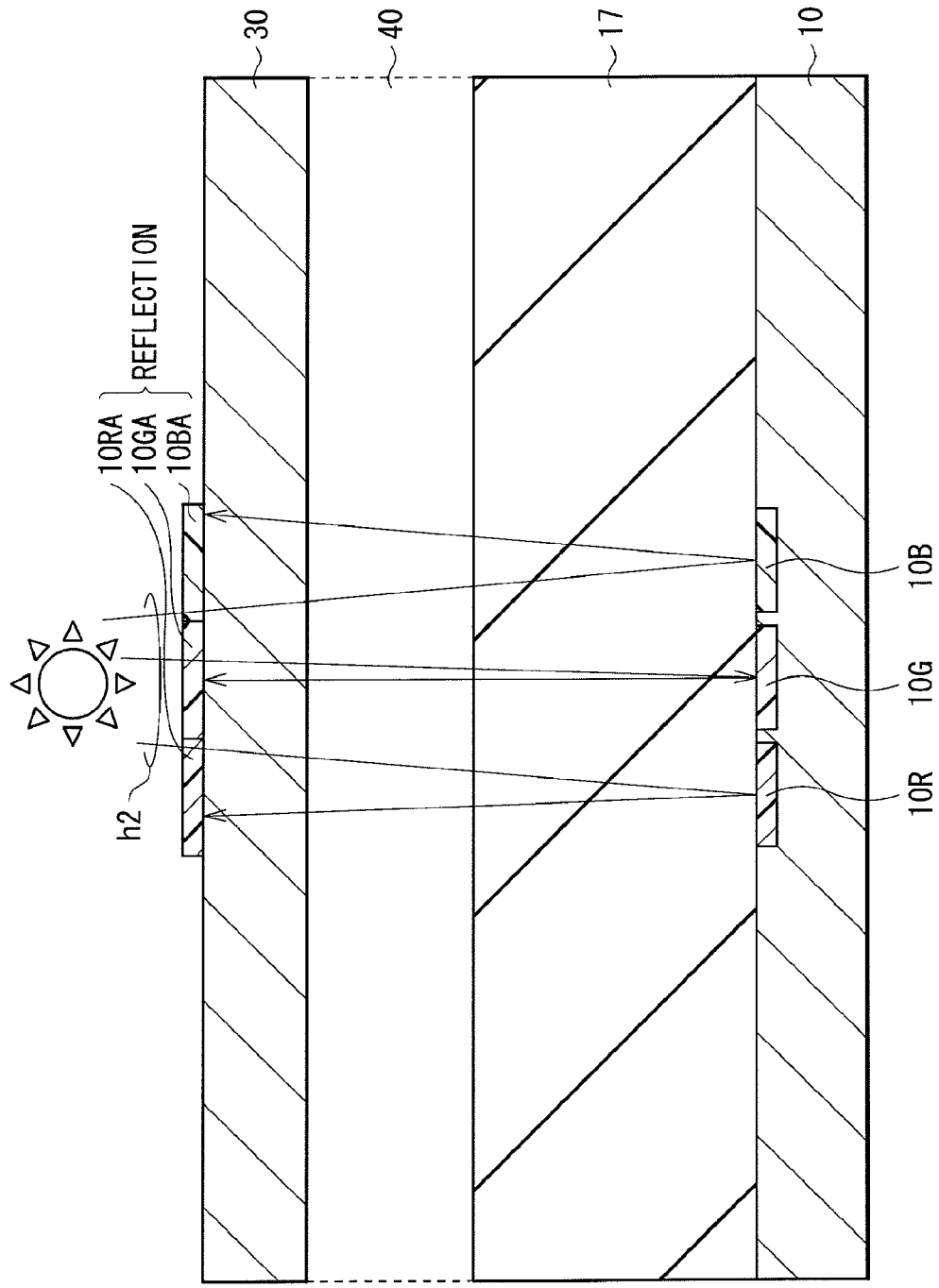
FIG. 19 is a sectional view for describing a function at the time of non-light emission of the protective film in related art.

Moreover, in related art, while the organic light-emitting elements 10R, 10G and 10B do not emit light, as illustrated in FIG. 19, the outside light h2 is reflected from the first electrodes 13 or the second electrode 16 of the organic light-emitting elements 10R, 10G and 10B to form reflections 10RA, 10GA and 10BA on the sealing substrate 31, thereby causing picture unevenness.

Light entering into the surface of the first electrode 13 made of a metal with high reflectivity through the insulating film 14 having a refractive component causes multiple interference in the insulating film 14, and reflected light with an interference pattern derived from the refractive component is generated on the sealing substrate 31 to cause an damage to display. In related art, to reduce the influence of the interference pattern, a pixel aperture ratio under constraints to the configuration of the insulating film 14 is changed. When the pixel aperture ratio is changed to be reduced, it is necessary to increase an output for obtaining necessary luminance, thereby causing an issue such as a reduction in light emission lifetime.

However, in the embodiment, as described above, the outside light h2 or the reflected light thereof is scattered by the asperities 21 on the top surface of the outermost layer 24; therefore, the reflected light with the interference pattern is prevented, and it is not necessary to provide constraints to the configuration of the insulating film 14 as measures against a damage to display on the sealing substrate 31.

Thus, in the optically-functional film 20 according to the embodiment, as the asperities 21 are arranged on the top surface of the outermost layer 24, the asperities 21 are allowed to have an optical function such as scattering, and unlike related art, it is not necessary to separately bond a binder to which a scatterer is added, and moisture diffusion from the binder is eliminated; therefore, peeling due to adhesion failure or deterioration due to moisture diffusion is preventable. When the display is configured with use of the optically-functional film 20, a decline in luminance or a color change depending on a viewing angle is preventable, and higher-quality display is achievable.

In the method of manufacturing the optically-functional film 20 according to the embodiment, or the method of manufacturing the display according to the embodiment, during or after the formation of the intermediate layer 23, the generation of plasma is stopped, and then restarts; therefore, the silicon-containing particles 25 are formed in the intermediate layer 23 or on the top surface of the intermediate layer 23, and the outermost layer 24 is formed with use of the silicon-containing particles 25 as nuclei so as to form the asperities 21 on the top surface of the outermost layer 24. Therefore, the asperities 21 are allowed to be formed with high controllability, and the optically-functional film 20 or the display according to the embodiment is allowed to be manufactured easily. Moreover, the silicon-containing particles 25 and the asperities 21 are allowed to be formed with use of plasma CVD as a manufacturing step; therefore, the optically-functional film 20 is allowed to be formed in situ concurrently with the formation of the protective film.

Second Embodiment

Figure 20:
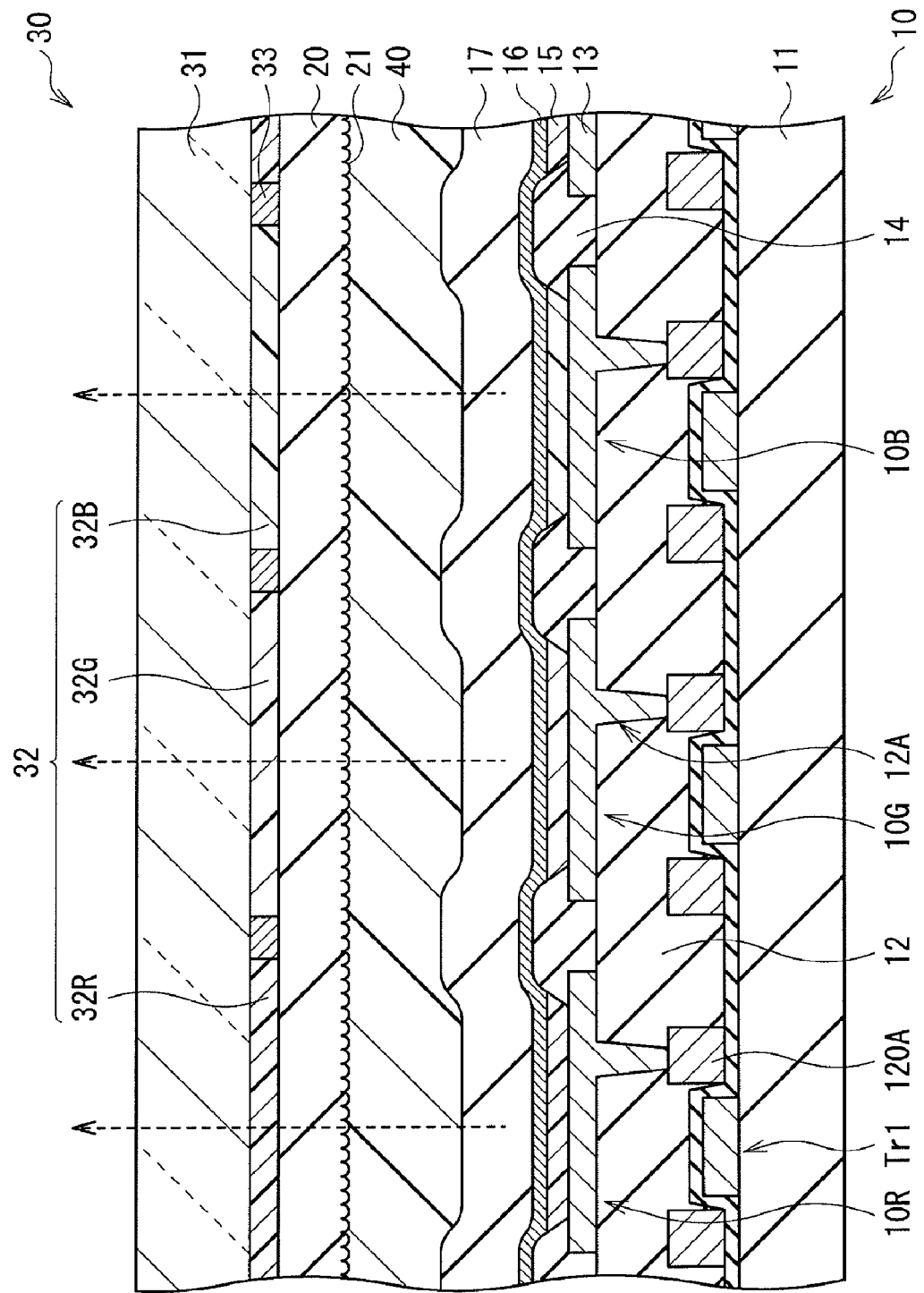
FIG. 20 is a sectional view illustrating a configuration of a display region of a display according to a second embodiment.

FIG. 20 illustrates a sectional configuration of the display region 110 in a display according to a second embodiment. The display has the same configuration as that of the first embodiment, except that the optically-functional film 20 is arranged on the adhesive layer 40 side of the sealing panel 30. Therefore, in the following description, like components are denoted by like numerals as of the first embodiment.

As in the case of the first embodiment, the display panel 10 includes the organic light-emitting elements 10R, 10G and 10B on the substrate 11. If necessary, the organic light-emitting elements 10R, 10G and 10B are covered with a protective film 17 made of silicon nitride or silicon oxide.

Figure 21:
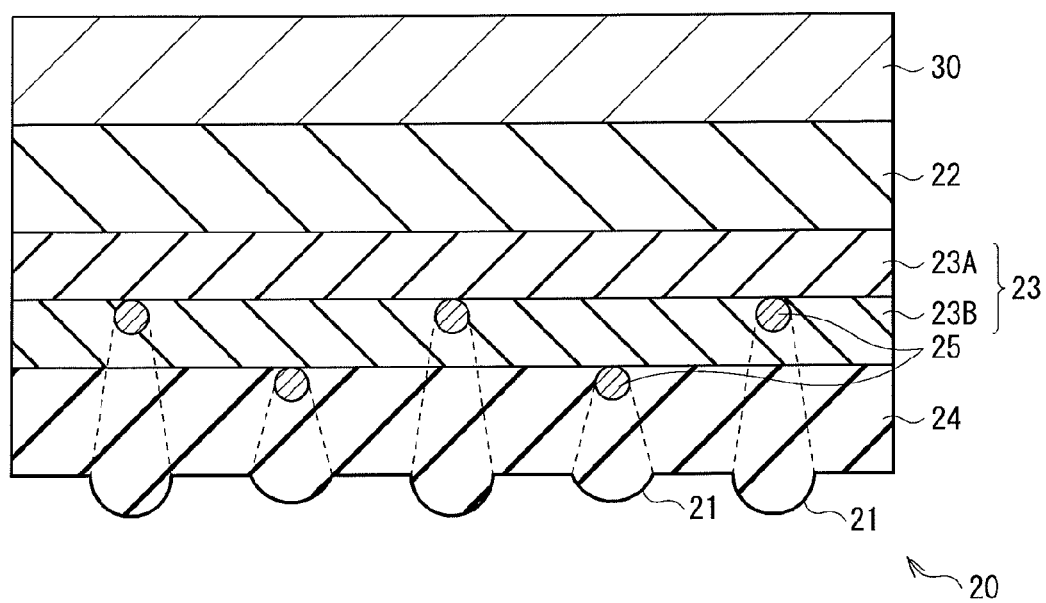
FIG. 21 is an enlarged sectional view of an optically-functional film illustrated in FIG. 20.

The optically-functional film 20 has the same configuration as that of the first embodiment, except that the optically-functional film 20 is arranged on the color filter 32 and the light-shielding film 33 of the sealing panel 30. In other words, as illustrated in FIG. 21, the optically-functional film 20 has, for example, a three-layer configuration in which the lower layer 22 made of high-density silicon nitride, the intermediate layer 23 made of low-density silicon nitride and the outermost layer 24 made of high-density silicon nitride are laminated in order from the sealing panel 30 side.

The intermediate layer 23 includes the silicon-containing particles 25 therein or the top surface thereof. The outermost layer 24 has asperities 21 on the top surface thereof. Therefore, in the optically-functional film 20, as in the case of the first embodiment, peeling due to adhesion failure or deterioration due to moisture diffusion is preventable, and a decline in luminance depending on a viewing angle of the display is allowed to be reduced.

The sealing panel 30 and the adhesive layer 40 have the same configurations as those in the first embodiment.

The display is allowed to be manufactured by, for example, the following steps. Note that steps overlapping the steps in the first embodiment will be described referring to FIGS. 6A and 6B to FIGS. 13A, 13B and 13C.

First, as in the case of the first embodiment, the sealing panel 30 is formed by the steps illustrated in FIGS. 13A, 13B and 13C.

Figure 22A:
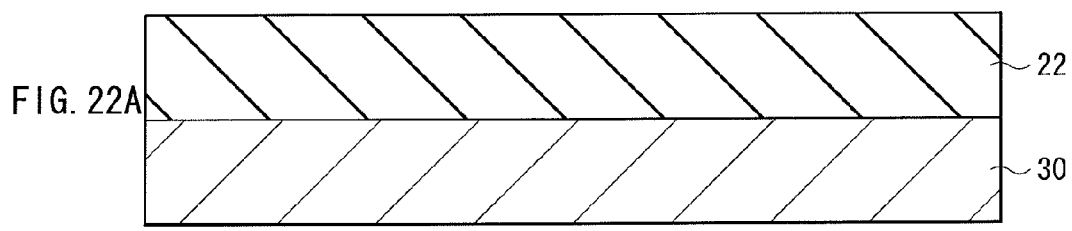
FIGS. 22A and 22B are sectional views illustrating a method of manufacturing the display illustrated in FIG. 20 in order of steps.

Next, as illustrated in FIG. 22A, the lower layer 22 made of, for example, high-density silicon nitride with a thickness of approximately 1000 nm is formed on the color filter 32 and the light-shielding film 33 of the sealing panel 30 by, for example, a plasma CVD method.

Figure 22B:
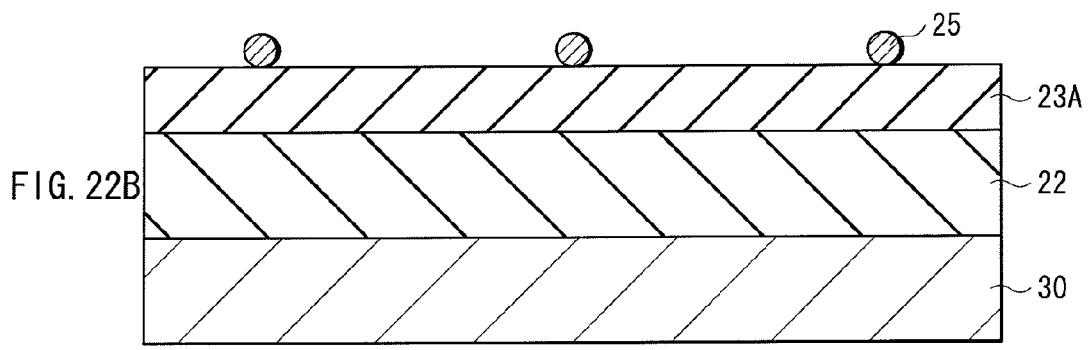

Then, as illustrated in FIG. 22B, the first intermediate layer 23A made of, for example, silicon nitride is formed by, for example, a plasma CVD method. At this time, the total flow rate of the ammonia gas and the silane gas as the material gases is increased, and film formation is performed under a low temperature ranging from room temperature to 150° C. both inclusive; therefore, gas phase reactions are increased to accelerate the film formation rate, thereby allowing the first intermediate layer 23A to be formed of low-density silicon nitride.

After the first intermediate layer 23A is formed, the generation of plasma is stopped, and then restarts. Therefore, the silicon-containing particles 25 are formed on the top surface of the first intermediate layer 23A.

Figure 23A:
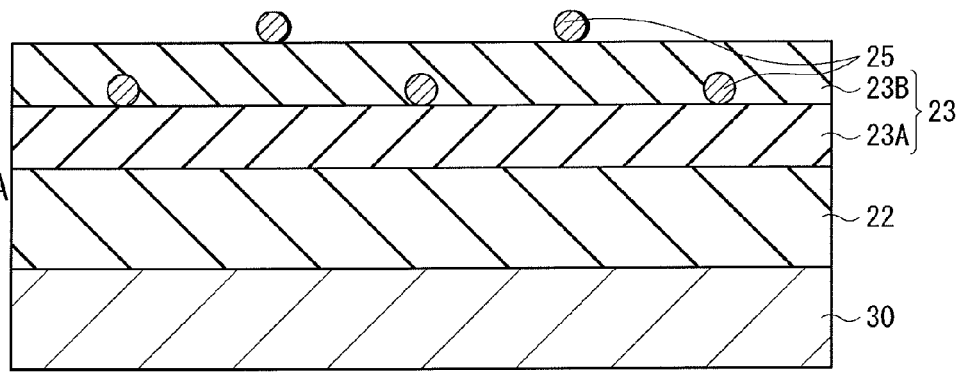
FIGS. 23A and 23B are sectional views illustrating steps following FIGS. 22A and 22B.

After the silicon-containing particles 25 are formed, as illustrated in FIG. 23A, the second intermediate layer 23B made of, for example, silicon nitride is formed by, for example, a plasma CVD method. At this time, as in the case of the first intermediate layer 23A, for example, the total flow rate of the ammonia gas and the silane gas as the material gases is increased, and film formation is performed under a low temperature ranging from room temperature to 150° C. both inclusive; therefore, gas phase reactions are increased to accelerate the film formation rate, thereby allowing the second intermediate layer 23B to be formed of low-density silicon nitride.

After the second intermediate layer 23B is formed, the generation of plasma is stopped, and then restarts. Therefore, as in the case of the first intermediate layer 23A, the silicon-containing particles 25 are formed on the top surface of the second intermediate layer 23B. Thus, the intermediate layer 23 including the silicon-containing particles 25 therein (on a boundary surface between the first intermediate layer 23A and the second intermediate layer 23B) and on the top surface thereof (on the top surface of the second intermediate layer 23B) is formed.

Figure 23B:
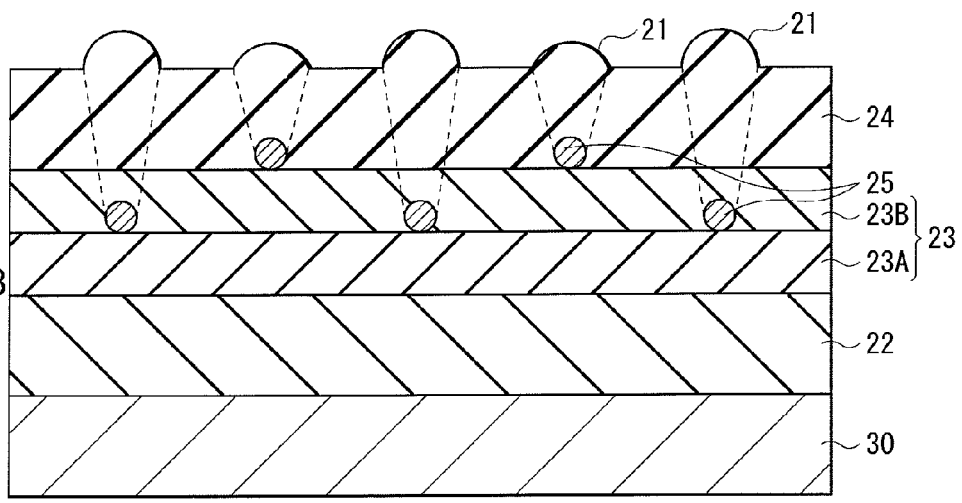

After the intermediate layer 23 is formed, as illustrated in FIG. 23B, the outermost layer 24 made of, for example, high-density silicon nitride is formed by, for example, a plasma CVD method. The outermost layer 24 is formed by growth from the silicon-containing particles 25 as nuclei to form asperities 21 on the top surface thereof. Thus, as illustrated in FIG. 24A, the optically-functional film 20 having asperities 21 on an outermost surface thereof is formed.

Step of Forming Display Panel 10

Moreover, as illustrated in the first embodiment, the display panel 10 including the organic light-emitting elements 10R, 10G and 10B on the substrate 11 is formed by the steps illustrated in FIGS. 6A and 6B to FIGS. 8A to 8B. After that, as illustrated in FIG. 24B, the protective film 17 made of the above-described material is formed on the surfaces of the organic light-emitting elements 10R, 10G and 10B by, for example, a CVD method.

Step of Bonding Display Panel 10 and Sealing Panel 30

After the display panel 10, the optically-functional film 20 and the sealing panel 30 are formed, the sealing panel 30 are arranged so as to face the organic light-emitting elements 10R, 10G and 10B of the display panel 10, and is bonded to a whole surface of the display panel 10 with the adhesive layer 40. Thus, the display illustrated in FIG. 20 is completed.

The functions and effects of the display are the same as those in the first embodiment.

MODULE AND APPLICATION EXAMPLES OF DISPLAY

Application examples of the display described in any of the above-described embodiments will be described below. The display according to any of the above-described embodiments is applicable to displays of electronic devices displaying a picture signal supplied from outside or a picture signal produced inside as an image or a picture in any fields, such as televisions, digital cameras, notebook personal computers, portable terminal devices such as cellular phones, and video cameras.

Module of Display

Figure 25:
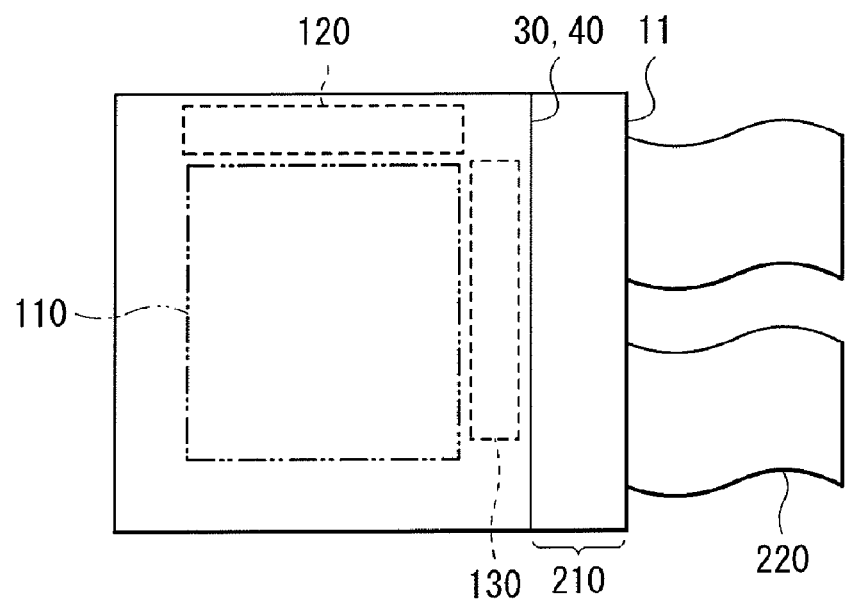
FIG. 25 is a plan view illustrating a schematic configuration of a module including the display according to any of the above-described embodiments.

The display according to any of the above-described embodiments is incorporated into various electronic devices such as Application Examples 1 to 5 which will be described later as a module as illustrated in FIG. 25. In the module, for example, a region 210 exposed from the sealing panel 30 and the adhesive layer 40 is arranged on a side of the substrate 11, and an external connection terminal (not illustrated) is formed in the exposed region 210 by extending the wiring of the signal line drive circuit 120 and the scanning line drive circuit 130. In the external connection terminal, a flexible printed circuit (FPC) 220 for signal input/output may be arranged.

Application Example 1 of Display

Figure 26:
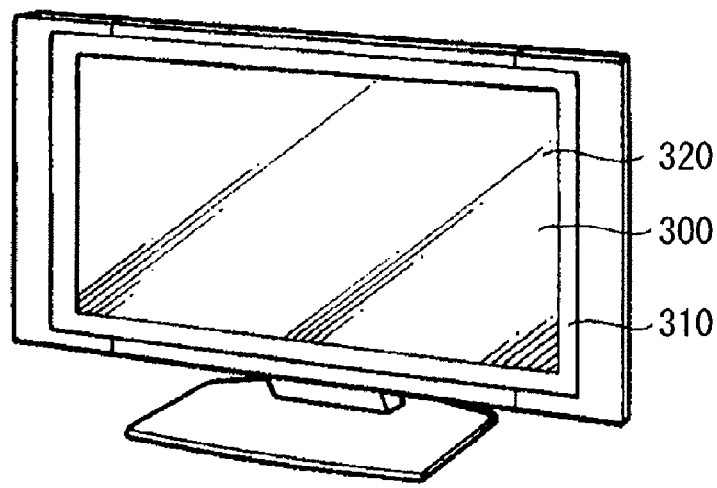
FIG. 26 is an external perspective view of Application Example 1 of the display according to any of the above-described embodiments.

FIG. 26 illustrates an appearance of a television to which the display according to any of the above-described embodiments is applied. The television has, for example, a picture display screen section 300 including a front panel 310 and a filter glass 320, and the picture display screen section 300 is configured of the display according to any of the above-described embodiments.

Application Example 2 of Display

Figure 27A:
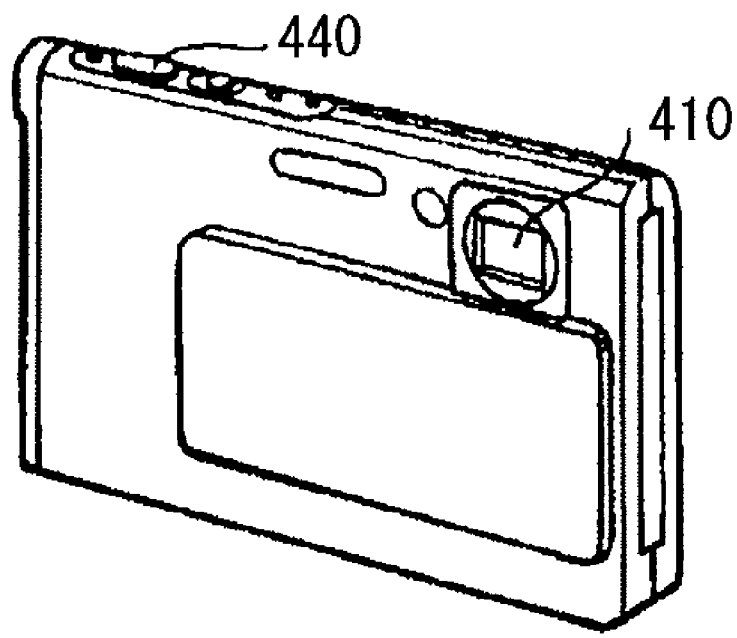
FIGS. 27A and 27B are external perspective views of Application Example 2 from a front side and a back side, respectively.
Figure 27B:
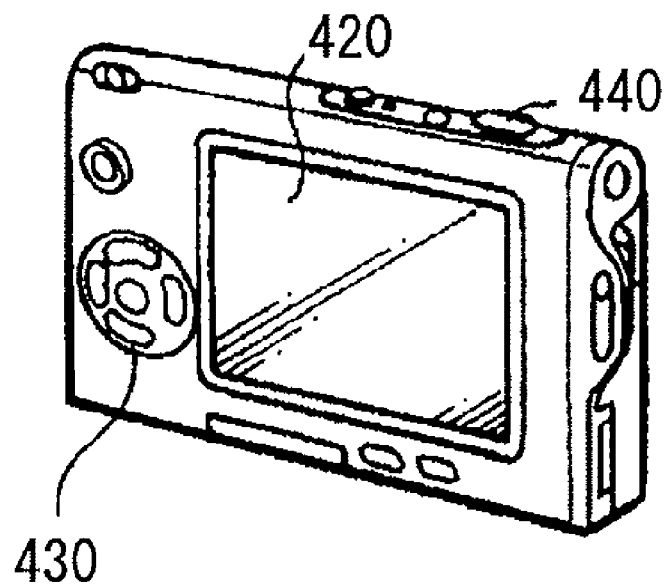

FIG. 27 illustrates an appearance of a digital camera to which the display according to any of the above-described embodiments is applied. The digital camera has, for example, a light-emitting section for a flash 410, a display section 420, a menu switch 430, and a shutter button 440, and the display section 420 is configured of the display according to any of the above-described embodiments.

Application Example 3 of Display

Figure 28:
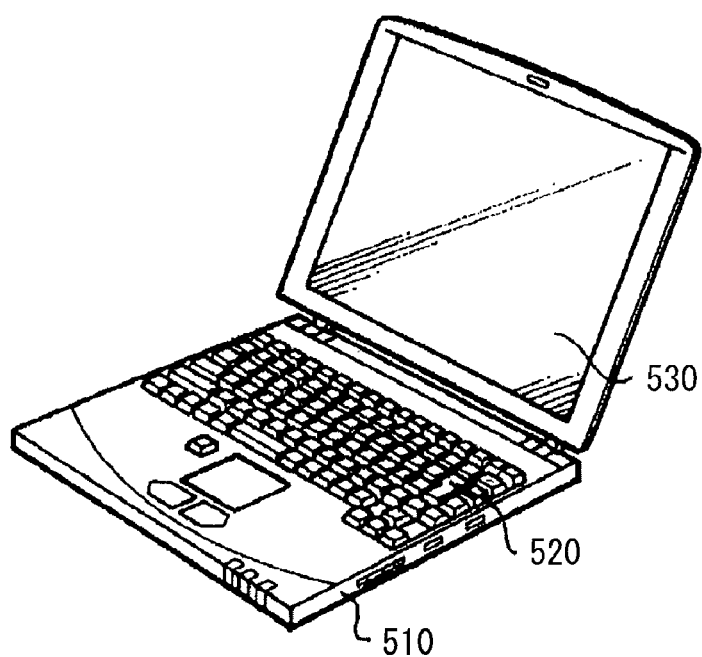
FIG. 28 is an external perspective view of Application Example 3.

FIG. 28 illustrates an appearance of a notebook personal computer to which the display according to any of the above-described embodiments is applied. The notebook personal computer has, for example, a main body 510, a keyboard 520 for operation of inputting characters and the like, a display section 530 for displaying an image, and the display section 530 is configured of the display according to any of the above-described embodiments.

Application Example 4 of Display

Figure 29:
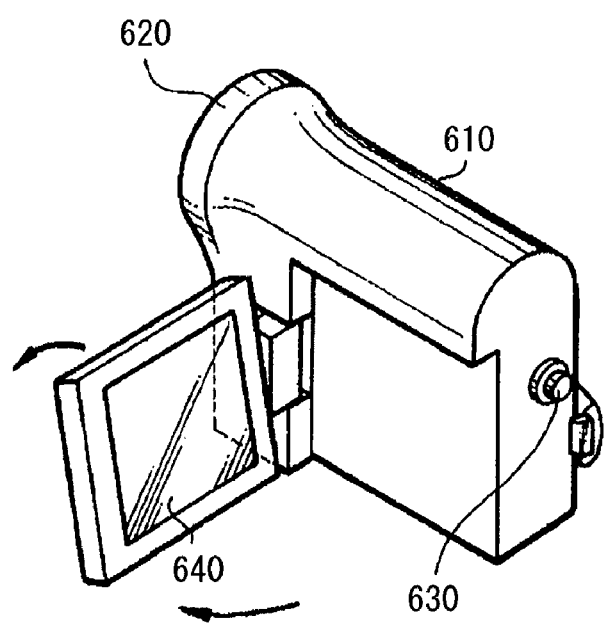
FIG. 29 is an external perspective view of Application Example 4.

FIG. 29 illustrates an appearance of a video camera to which the display according to any of the above-described embodiments is applied. The video camera has, for example, a main body 610, a lens for shooting an object 620 arranged on a front surface of the main body 610, a shooting start/stop switch 630, and a display section 640, and the display section 640 is configured of the display according to any of the above-described embodiments.

Application Example 5 of Display

Figure 30:
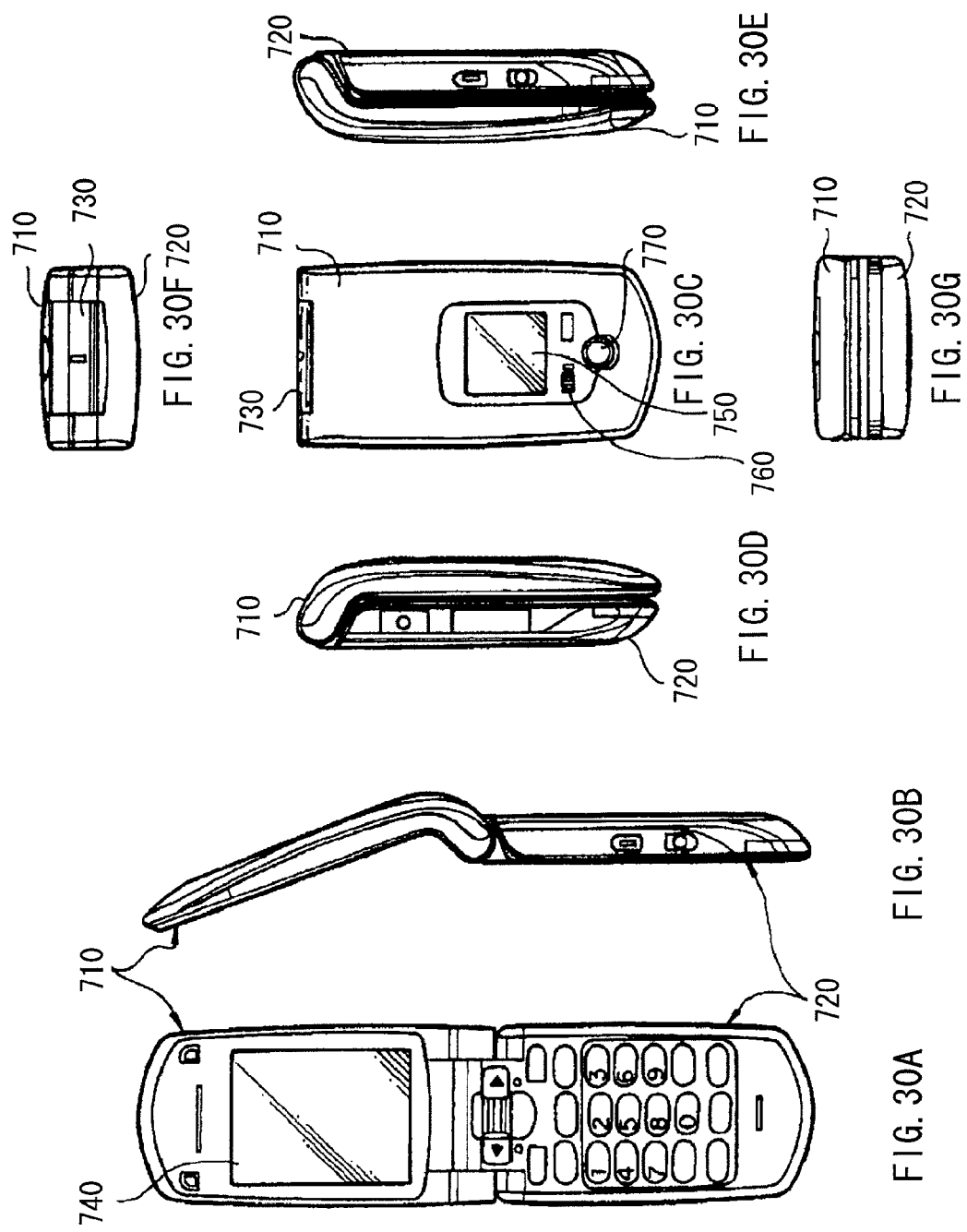
FIGS. 30A to 30G illustrate Application Example 5 where

FIG. 30 illustrates an appearance of a cellular phone to which the display according to any of the above-described embodiments is applied. The cellular phone is formed by connecting, for example, a top-side enclosure 710 and a bottom-side enclosure 720 to each other by a connection section (hinge section) 730, and the cellular phone has a display 740, a sub-display 750, a picture light 760, and a camera 770. The display 740 or the sub-display 750 is configured of the display according to any of the above-described embodiments.

Application Example of Optically-Functional Film

The optically-functional film 20 according to any of the above-described embodiments is applicable to a wide variety of electronic devices such as an optical confinement film in a solar cell or an anti-reflection (AR) film of a liquid crystal display, and the silicon-containing particles 25 are applicable to, for example, formation of fine-particle nuclei of a quantum dot solar cell.

Application Example 1 of Optically-Functional Film

FIG. 31 illustrates a configuration of a dye sensitized solar cell to which the optically-functional film 20 according to any of the above-described embodiments is applied. In the dye sensitized solar cell, a transparent substrate 810 and a substrate 820 are arranged to face each other, and all components are contained and sealed in a case 830.

The transparent substrate 810 is a substrate on a light incident side, and a transparent electrode 811 made of ITO (Indium Tin Oxide) or the like and a metal oxide semiconductor layer (semiconductor electrode) 821 are arranged on an internal surface of the transparent substrate 810. The metal oxide semiconductor layer 812 is formed by sintering metal oxide semiconductor fine particles on the transparent electrode 811, and supports a sensitizing dye (not illustrated).

The substrate 820 includes an electrode 821 and an opposed electrode 822. The electrode 821 is configured of glass, transparent conductive glass, metal, a polymer film or the like. The opposed electrode 822 includes carbon supporting metal such as platinum and a binder polymer. The metal oxide semiconductor layer 812 and the opposed electrode 822 are arranged to face each other with a predetermined space in between, and an electrolyte layer 840 is arranged in the space. The transparent electrode 812 and the opposed electrode 822 are connected to each other through a conductive wire to configure a current circuit 850 with an ammeter 851.

The optically-functional film 20 according to any of the above-described embodiments is arranged on an external light incident surface of the transparent substrate 810. Therefore, in the dye sensitized solar cell, when light enters into the optically-functional film 20, reflected light is prevented by the asperities 21 to efficiently confine light in the dye sensitized solar cell.

Although the present application is described referring to the embodiment, the application is not limited thereto, and may be variously modified. For example, in the above-described embodiments, a CF-integrated type in which the color filter 32 is formed in the sealing panel 30 is described. However, the application is applicable to a CF-less configuration not including the color filter 32.

Moreover, for example, the material and thickness of each layer, the method and conditions of forming each layer are not limited to those described in the above-described embodiments, and each layer may be made of any other material with any other thickness by any other method under any other conditions.

Further, in the above-described embodiments, the configurations of the organic light-emitting elements 10R, 10B and 10G are specifically described; however, all layers are not necessarily included, or any other layer may be further included.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. An optically-functional film comprising:
   an intermediate layer, made of an insulating material including silicon, and having silicon-containing particles therein or on a top surface thereof; and
   an outermost layer made of the same material as that of the intermediate layer, whereas having a density higher than that of the intermediate layer, and having a bottom surface in contact with a top surface of the intermediate layer and a top surface with asperities.

2. The optically-functional film according to claim 1, wherein
   the insulating material is silicon nitride.

3. The optically-functional film according to claim 2, wherein
   the intermediate layer includes a plurality of layers, and
   the silicon-containing particles in the intermediate layer are placed on a boundary surface between the plurality of layers.

4. The optically-functional film according to claim 3, further comprising:
   a lower layer arranged in contact with a bottom surface of the intermediate layer, the lower layer being made of the same material as that of the intermediate layer, whereas having a density higher than that of the intermediate layer.

5. The optically-functional film according to claim 4, wherein
   the optically-functional film functions as a scattering film, in which the asperities of the outermost layer allow incident light which enters into the top surface of the outermost layer to be scattered.

6. A method of manufacturing an optically-functional film comprising:
   forming an intermediate layer made of an insulating material including silicon by a plasma CVD method; and
   forming an outermost layer by a plasma CVD method, the outermost layer arranged in contact with a top surface of the intermediate layer, made of the same material as that of the intermediate layer, whereas having a density higher than the intermediate layer,
   wherein in the step of forming the intermediate layer, the generation of plasma is stopped, and then restarts during or after the formation of the intermediate layer to form silicon-containing particles in the intermediate layer or on a top surface of the intermediate layer, and
   the outermost layer is formed with use of the silicon-containing particles as nuclei to form asperities on a top surface thereof.

7. The method of manufacturing an optically-functional film according to claim 6, wherein
   the intermediate layer is formed under a temperature ranging from room temperature to 150° C. both inclusive.

8. A display comprising:
   a display panel including an organic light-emitting element on a substrate; and
   an optically-functional film arranged on a light extraction side of the display panel, wherein the optically-functional film includes:
an intermediate layer, made of an insulating material including silicon, and having silicon-containing particles therein or on a top surface thereof; and
an outermost layer made of the same material as that of the intermediate layer, whereas having a density higher than that of the intermediate layer, and having a bottom surface in contact with a top surface of the intermediate layer and a top surface with asperities.

9. The display according to claim 8, wherein
the optically-functional film is arranged on a surface of the organic light-emitting element.

10. The display according to claim 8, further comprising:
a sealing panel provided to face the organic light-emitting element of the display panel; and
an adhesive layer provided over whole region between the display panel and the sealing panel,
wherein the optically-functional film is provided on the adhesive layer side of the sealing panel.

11. A method of manufacturing a display, comprising:
forming a display panel with an organic light-emitting element on a substrate; and
forming an optically-functional film on a surface of the organic light-emitting element, the step of forming the optically-functional film including the steps of:
forming an intermediate layer made of an insulating material including silicon by a plasma CVD method, and
forming an outermost layer by a plasma CVD method, the outermost layer arranged in contact with a top surface of the intermediate layer, made of the same material as that of the intermediate layer, whereas having a density higher than the intermediate layer,
wherein in the step of forming the intermediate layer, the generation of plasma is stopped, and then restarts during or after the formation of the intermediate layer to form silicon-containing particles in the intermediate layer or on a top surface of the intermediate layer, and
the outermost layer is formed with use of the silicon-containing particles as nuclei to form asperities on a top surface thereof.

12. A method of manufacturing a display, comprising:
forming a display panel with an organic light-emitting element on a substrate;
forming an optically-functional film on a surface of a sealing panel; and
arranging the optically-functional film of the sealing panel to face the organic light-emitting element of the display panel and entirely bonding the display panel and the sealing panel with an adhesive layer, the step of forming the optically-functional film including the steps of:
forming an intermediate layer made of an insulating material including silicon by a plasma CVD method, and
forming an outermost layer by a plasma CVD method, the outermost layer arranged in contact with a top surface of the intermediate layer, made of the same material as that of the intermediate layer, whereas having a density higher than the intermediate layer,
wherein in the step of forming the intermediate layer, the generation of plasma is stopped, and then restarts during or after the formation of the intermediate layer to form silicon-containing particles in the intermediate layer or on a top surface of the intermediate layer, and
the outermost layer is formed with use of the silicon-containing particles as nuclei to form asperities on a top surface thereof.

* * * * *